US008716716B2

(12) United States Patent
Nie et al.

(10) Patent No.: US 8,716,716 B2
(45) Date of Patent: May 6, 2014

(54) METHOD AND SYSTEM FOR JUNCTION TERMINATION IN GAN MATERIALS USING CONDUCTIVITY MODULATION

(75) Inventors: Hui Nie, Cupertino, CA (US); Andrew P. Edwards, San Jose, CA (US); Donald R. Disney, Cupertino, CA (US); Richard J. Brown, Los Gatos, CA (US); Isik C. Kizilyalli, San Francisco, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 13/334,742

(22) Filed: Dec. 22, 2011

(65) Prior Publication Data

US 2013/0161633 A1 Jun. 27, 2013

(51) Int. Cl.
*H01L 21/335* (2006.01)
*H01L 29/20* (2006.01)

(52) U.S. Cl.
USPC .......... 257/76; 257/77; 257/266; 257/E21.09; 257/E21.359; 257/E29.089; 438/193; 438/478; 438/576

(58) Field of Classification Search
USPC ................ 257/76, 77, 266, E21.09, E21.359, 257/E29.089; 438/193, 478, 576
See application file for complete search history.

(56) References Cited

U.S. PATENT DOCUMENTS

| 5,712,502 A | 1/1998 | Mitlehner |
| 6,566,726 B1 | 5/2003 | Onose et al. |
| 7,304,363 B1 | 12/2007 | Shah |
| 2005/0045982 A1 | 3/2005 | Shenai |
| 2006/0068571 A1 | 3/2006 | Chow et al. |
| 2007/0170436 A1 | 7/2007 | Sugawara |
| 2009/0278172 A1 | 11/2009 | Kaya et al. |
| 2010/0032685 A1 | 2/2010 | Zhang et al. |
| 2010/0055882 A1 | 3/2010 | Imhoff et al. |
| 2010/0289032 A1 | 11/2010 | Zhang et al. |
| 2010/0291762 A1 | 11/2010 | Tarui |
| 2013/0119394 A1* | 5/2013 | Zhu et al. .................. 257/76 |
| 2013/0126888 A1* | 5/2013 | Kizilyalli et al. ........... 257/76 |
| 2013/0146886 A1* | 6/2013 | Disney et al. ............... 257/76 |

OTHER PUBLICATIONS

Binari et al, "H, He, and N implant isolation of n-type GaN," Journal of Applied Physics, Sep. 1, 1995, vol. 78 Issue:5, American Institute of Physics, 4 pages.
Notification of Transmittal of the International Search Report and the Written Opinion of the International Searching Authority, or the Declaration; International Search Report and Written Opinion of the International Searching Authority for corresponding International application No. PCT/US2012/069251 mailed on Mar. 8, 2013, 8 pages.

* cited by examiner

*Primary Examiner* — Dao H Nguyen
(74) *Attorney, Agent, or Firm* — Kilpatrick Townsend & Stockton LLP

(57) ABSTRACT

A semiconductor structure includes a GaN substrate having a first surface and a second surface opposing the first surface. The GaN substrate is characterized by a first conductivity type and a first dopant concentration. The semiconductor structure also includes a first GaN epitaxial layer of the first conductivity type coupled to the second surface of the GaN substrate and a second GaN epitaxial layer of a second conductivity type coupled to the first GaN epitaxial layer. The second GaN epitaxial layer includes an active device region, a first junction termination region characterized by an implantation region having a first implantation profile, and a second junction termination region characterized by an implantation region having a second implantation profile.

10 Claims, 22 Drawing Sheets

METHOD AND SYSTEM FOR JUNCTION TERMINATION IN GAN MATERIALS USING CONDUCTIVITY MODULATION

BACKGROUND OF THE INVENTION

Power electronics are widely used in a variety of applications. Power semiconductor devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same. Vertical power devices, in which the primary current flows from the top surface vertically down through the substrate, are often used in applications that require high voltage and/or current levels.

SUMMARY OF THE INVENTION

The present invention relates generally to electronic devices. More specifically, the present invention relates to forming junction termination structures using implantation processes in III-nitride semiconductor materials. Merely by way of example, the invention has been applied to methods and systems for providing junction termination for semiconductor devices using ion implantation into gallium-nitride (GaN) based epitaxial layers to modulate the conductivity of the epitaxial layers as a function of position. Embodiments of the present invention provide junction termination structures operable to electrically relax corner electrical fields. The methods and techniques can be applied to a variety of power semiconductor devices such as Schottky diodes, PN diodes, vertical junction field-effect transistors (JFETs), thyristors, bipolar transistors, and other devices.

According to an embodiment of the present invention, a method for fabricating a junction termination structure is provided. The method includes providing a substrate of a first conductivity type. The substrate has a first surface and a second surface. The method also includes forming a first GaN epitaxial layer of the first conductivity type coupled to the first surface of the substrate and forming a second GaN epitaxial layer of a second conductivity type opposite to the first conductivity type. The second GaN epitaxial layer is coupled to the first GaN epitaxial layer. The method further includes implanting ions into a first region of the second GaN epitaxial layer to form a first junction termination element characterized by a first conductivity less than a conductivity of the second GaN epitaxial layer and implanting ions into a second region of the second GaN epitaxial layer to form a second junction termination element characterized by a second conductivity less than the first conductivity.

According to another embodiment of the present invention, a method of fabricating a vertical power device structure is provided. The method includes forming an epitaxial structure by providing a III-nitride substrate of a first conductivity type characterized by a first dopant concentration, forming a first III-nitride epitaxial layer of the first conductivity type coupled to a first surface of the III-nitride substrate, and forming a second III-nitride epitaxial layer of a second conductivity type coupled to the first III-nitride epitaxial layer. The second III-nitride epitaxial layer has a surface opposing the first III-nitride epitaxial layer. The method also includes defining regions of differing conductivity by implanting ions into the surface of the second epitaxial layer to form a set of implantation regions of the epitaxial structure and forming one or more active devices using at least a device region of the epitaxial structure.

According to a specific embodiment of the present invention, a semiconductor structure is provided. The semiconductor structure includes a GaN substrate having a first surface and a second surface opposing the first surface. The GaN substrate is characterized by a first conductivity type and a first dopant concentration. The semiconductor structure also includes a first GaN epitaxial layer of the first conductivity type coupled to the second surface of the GaN substrate and a second GaN epitaxial layer of a second conductivity type coupled to the first GaN epitaxial layer. The second GaN epitaxial layer includes an active device region, a first junction termination region characterized by an implantation region having a first implantation profile, and a second junction termination region characterized by an implantation region having a second implantation profile.

Numerous benefits are achieved by way of the present invention over conventional techniques. For example, embodiments of the present invention provide a high degree of conductivity modulation between a device region and a junction termination region. In contrast to etched junction termination techniques (e.g. etching through at least a portion of one or more epitaxial layers) the present invention provides final structures that are fully planar, that do not have any etched sidewalls (which can be a source of off-state leakage current), and that are less expensive to manufacture. These and other embodiments of the invention, along with many of its advantages and features, are described in more detail in conjunction with the text below and attached figures.

BRIEF DESCRIPTION OF THE DRAWINGS

FIGS. 2-7A are simplified cross-sectional diagrams illustrating the fabrication of a Schottky diode in gallium-nitride with junction termination structures formed through ion implantation into an epitaxial layer according to an embodiment of the present invention;

FIGS. 8A-10A are simplified cross-sectional diagrams illustrating fabrication of a PN diode in GaN with junction termination structures formed through ion implantation into an epitaxial layer according to another embodiment of the present invention;

Figure 1A:
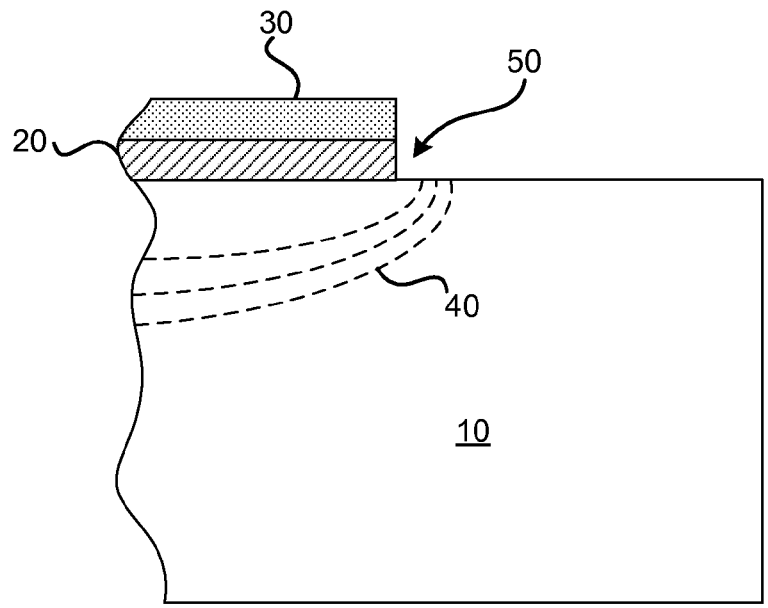
FIGS. 1A-1B are simplified cross-sectional diagrams of a portion of a semiconductor device illustrating how junction termination structures improve the semiconductor device's performance, according to an embodiment of the present invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Embodiments of the present invention relate to electronic devices. More specifically, the present invention relates to forming junction termination structures to provide junction termination for semiconductor devices. Merely by way of example, the invention has been applied to methods and systems for manufacturing junction termination structures using ion implantation into gallium-nitride (GaN) based epitaxial layers. The methods and techniques can be applied to form a variety of types of junction termination structures that can provide edge termination to numerous types of semiconductor devices, including, but not limited to, junction field-effect transistors (JFETs), diodes, thyristors, vertical field-effect transistors, thyristors, and other devices, including merged PN Schottky diodes such as those discussed in U.S. patent application Ser. No. 13/270,606, filed on Oct. 11, 2011, Ser. No. 13/300,028, filed on Nov. 18, 2011, Ser. No. 13/335,329, filed on Dec. 22, 2011, Ser. No. 13/299,254, filed on Nov. 17, 2011, and Ser. No. 13/335,355, filed on Dec. 22, 2011, the disclosures of which are hereby incorporated by reference in their entirety.

GaN-based electronic and optoelectronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, $\mu$, is higher than competing materials for a given background doping level, N. This provides low resistivity, $\rho$, because resistivity is inversely proportional to electron mobility, as provided by equation (1):

$$\rho = \frac{1}{q\mu N}, \quad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \quad (2)$$

where A is the cross-sectional area of the channel or current path.

As described herein, semiconductor devices utilizing junction termination structures are able to exploit the high critical electric field provided by GaN and related alloys and heterostructures. Additionally, junction termination techniques such as field plates and guard rings provide proper junction termination by alleviating high fields at the edge of the semiconductor device. When properly employed, junction termination allows a semiconductor device to break down uniformly at its main junction rather than uncontrollably at its edge. According to some embodiments of the present invention, the portion of the semiconductor device used to conduct current in the on-state is referred to as an active device, an active region, or an active device region, to differentiate this region or portion of the device from the junction termination region, which typically does not contribute to forward conduction. Examples of active devices described herein include Schottky diodes, PN diodes, PIN diodes, JFETs, and the like. Within the scope of this invention, the junction termination structures and methods described here may be combined with many other types of active devices fabricated in GaN substrates, including but not limited to MOSFETs, MESFETs, PN diodes, and the like. Further, conductivity modulation by implantation could be applied to fabricate various circuit elements in GaN-based integrated devices and circuits such as amplifiers, integrated FETs, and diodes.

According to embodiments of the present invention, gallium nitride (GaN) epitaxy on pseudo-bulk GaN substrates is utilized to fabricate junction termination structures and/or semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create edge termination structures for various types of semiconductor devices.

Figure 1B:
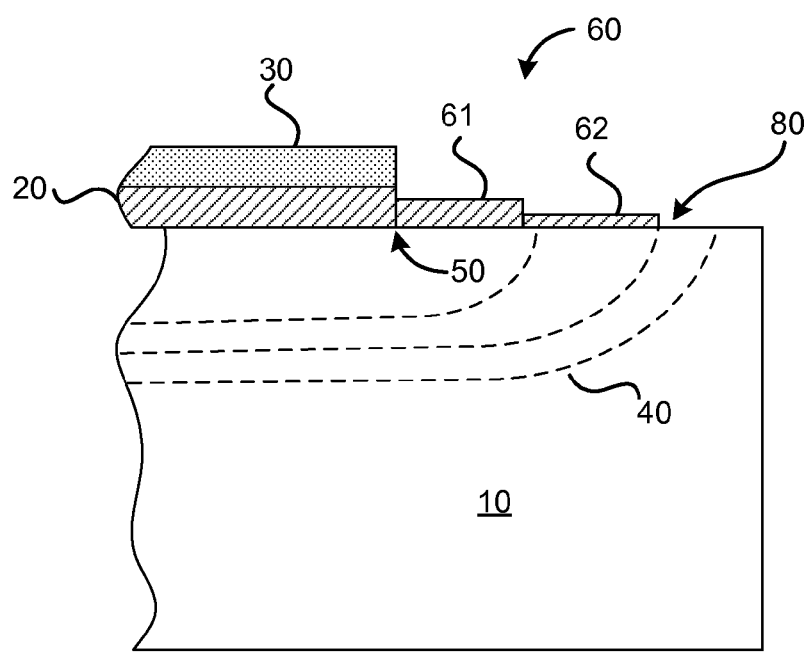

FIGS. 1A-1B are simplified cross-sectional diagrams of a portion of a semiconductor device, according to one embodiment, illustrating how the junction termination structures provided herein can be used to improve the semiconductor device's performance using junction termination. FIG. 1A illustrates a diode structure where a p-n junction is created between a p-type semiconductor layer 20 formed on an n-type semiconductor substrate 10, which can be an epitaxial layer. In this example, a metal layer 30 is also formed on the p-type semiconductor layer 20 to provide electrical connectivity to the diode. Layer 30 may or may not share the same edge as layer 20 in FIG. 1A and FIG. 1B.

Because the diode of FIG. 1A has no junction termination structures, its performance is reduced. The electric field 40 (represented in FIG. 1A as potential lines), is crowded near the edge 50 of the diode, causing breakdown at a voltage that can be much less than the parallel plane breakdown voltage for the diode. This phenomenon can be especially detrimental to the operation of high-voltage semiconductor devices.

FIG. 1B illustrates how junction termination elements 61 and 62, referred to collectively as junction termination structure 60 can be used to alleviate field crowding near the edge 50 of the diode. The junction termination elements 61 and 62, which can be made of the same p-type semiconductor material as the p-type semiconductor layer 20 of the diode, are placed adjacent to the active diode and given voltages such that the electric field 40 extends laterally beyond the edge 50 of the diode. By extending the potential drop and reducing the electric field in this manner, the junction termination elements 61 and 62 help enable the diode to operate at a breakdown voltage much closer to its parallel plane breakdown voltage.

Although the thickness of the junction termination elements 61 and 62 is illustrated as varying in FIG. 1B, this is not required by the present invention and planar structures that provide for a variation in the conductivity of the layer as a function of position are included within the scope of the present invention.

The number of junction termination elements 61 and 62 can vary. In some embodiments, a single junction termination element may be sufficient. In the embodiment illustrated in FIG. 1B, two junction termination elements are utilized. In other embodiments, at least three or more termination elements can be used. As described more fully herein, the conductivity of each junction termination element is optimized to allow each junction termination element to be depleted of free carriers at a low enough voltage such that the vertical electric field does not exceed the critical electric field at which breakdown occurs. In some embodiments, the maximum electric field in the junction termination structure 60 is lower than the peak field at the semiconductor's main junction, such that the semiconductor device operates at or near its parallel plane breakdown voltage.

As described below, the conductivity of the epitaxial layer(s) can be modified using an ion implantation process to reduce the conductivity with respect to the unimplanted state. The conductivity of the epitaxial layer will depend, in part, on the active dopants or charge in the epitaxial layer times the thickness of the layer (i.e., the integrated charge in the layer). The ion implantation processes used herein implant ionic species to increase the resistivity (i.e., decrease the conductivity) of predetermined portions of the epitaxial layer to provide a spatial variation or modulation in the conductivity. Without limiting embodiments of the present invention, the inventors believe that the implantation process reduces the conductivity by at least one of the following mechanisms: compensating for dopants, annihilating dopants, increasing vacancy density, increasing void density, decreasing the total net charge in the epitaxial layer, decreasing the density of ionized acceptors (donors for n-type material), some or all of which may provide for increased resistivity. Throughout the specification, reference is made to decreased conductivity or increased resistivity, which can also be referred to as a decrease in active charge, a decrease in active dopant species, or the like. Due to the robust nature of GaN-based materials, ion implantation can produce implanted ions interspersed with unchanged epitaxial material, effectively reducing the conductivity in an averaged sense, with voids or vacancies interspersed in the lattice with as-grown epitaxial material.

The present invention is not limited by the physical mechanism resulting in the spatial conductivity modulation.

The lateral conductivity profile is a predetermined profile according to embodiments of the present invention, enabling device designers to achieve a substantially ideal breakdown characteristic. Independent of the physical mechanism, embodiments of the present invention provide a set of junction termination elements that are characterized by differing active dopant densities or concentrations, with the outer junction termination elements having a lower active dopant density than inner junction termination elements. In some embodiments, an outermost junction termination element can be an isolation element characterized by high resistivity and can be fabricated by ion implantation, etching, combinations thereof, or the like.

The widths of the various elements of the junction termination structure 60 can also vary. According one embodiment, the width of the elements of the junction termination structure 60 range from 2 μm to 30 μm and can be approximately the same for all elements of the junction termination structure 60. In other embodiments, the widths vary. In one embodiment, the depth and doping concentration associated with the elements of the junction termination structure 60 can also vary, which can be modulated by ion implantation energy and dose.

As an example, the implantation dose can vary between elements, thereby varying the conductivity of the elements. Embodiments of the present invention provide benefits not available using convention techniques since the final surface is planar, enabling fine lithographic patterning. Additionally, in embodiments in which the implantation process is used as an alternative to an etch-based process, epitaxially grown surfaces are preserved, providing passivation benefits.

In another embodiment, the junction termination elements 61 and 62 with varying conductivity can be fabricated using one or multiple reduced charge layers, for example, with thicknesses varying from about 0.01 μm to about 5 μm. In another embodiment, spaces may be formed between junction termination structures 61 and 62, with the width between the elements increasing with distance from the semiconductor device, ranging, for example, from about 0.3 μm to about 6 μm. In other embodiments, other spacings are utilized as appropriate to the particular application.

Figure 2:
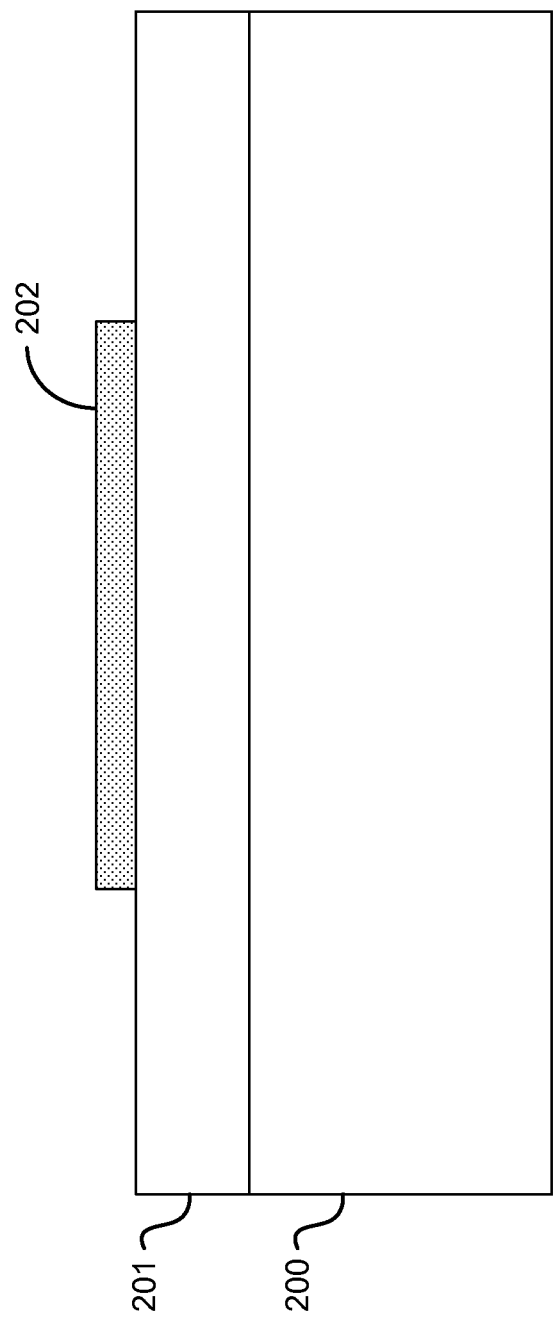

FIGS. 2-7 illustrate a process for creating a Schottky diode in GaN with junction termination structures formed using ion implantation to isolate different regions of an epitaxial layer from each other. Referring to FIG. 2, a first GaN epitaxial layer 201 is formed on a GaN substrate 200 having the same conductivity type. As indicated above, the GaN substrate 200 can be a pseudo-bulk or bulk GaN material on which the first GaN epitaxial layer 201 is grown. Dopant concentrations (e.g., doping density) of the GaN substrate 200 can vary, depending on desired functionality. For example, a GaN substrate 200 can have an n+ conductivity type, with dopant concentrations ranging from $1\times10^{17}$ cm$^{-3}$ to $1\times10^{19}$ cm$^{-3}$. Although the GaN substrate 200 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 201 can also vary, depending on desired functionality. The first GaN epitaxial layer 201 can serve as a drift region for the Schottky diode, and therefore can be a relatively low-doped material. For example, the first GaN epitaxial layer 201 can have an n− conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region.

The thickness of the first GaN epitaxial layer 201 can also vary substantially, depending on the desired functionality. As discussed above, homoepitaxial growth can enable the first GaN epitaxial layer 201 to be grown far thicker than layers formed using conventional methods. In general, in some embodiments, thicknesses can vary between 0.5 µm and 100 µm, for example. In other embodiments thicknesses are greater than 5 µm. Resulting parallel plane breakdown voltages for the Schottky diode 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

FIG. 2 also illustrates the formation of a regrowth mask 202. In one embodiment, regrowth mask 202 is formed by growing or depositing a layer of material that inhibits the growth of GaN material during the epitaxial regrowth process. This material may be, for example, silicon dioxide, silicon nitride, or another suitable material. The regrowth mask material is patterned in the illustrated embodiment by using photolithography and etching techniques such that the regrowth mask 202 covers at least a portion of the active area of the device (e.g., the Schottky contact area for a Schottky diode device) but the regrowth mask does not cover the edge termination area. The active region and edge termination region, as described below, are not limited to the definition provided by the regrowth mask 202 in some embodiments of the present invention.

Different dopants can be used to create n- and p-type GaN epitaxial layers and structures disclosed herein. For example, n-type dopants can include silicon, oxygen, selenium, tellurium, or the like. P-type dopants can include magnesium, beryllium, calcium zinc, or the like.

Figure 3:
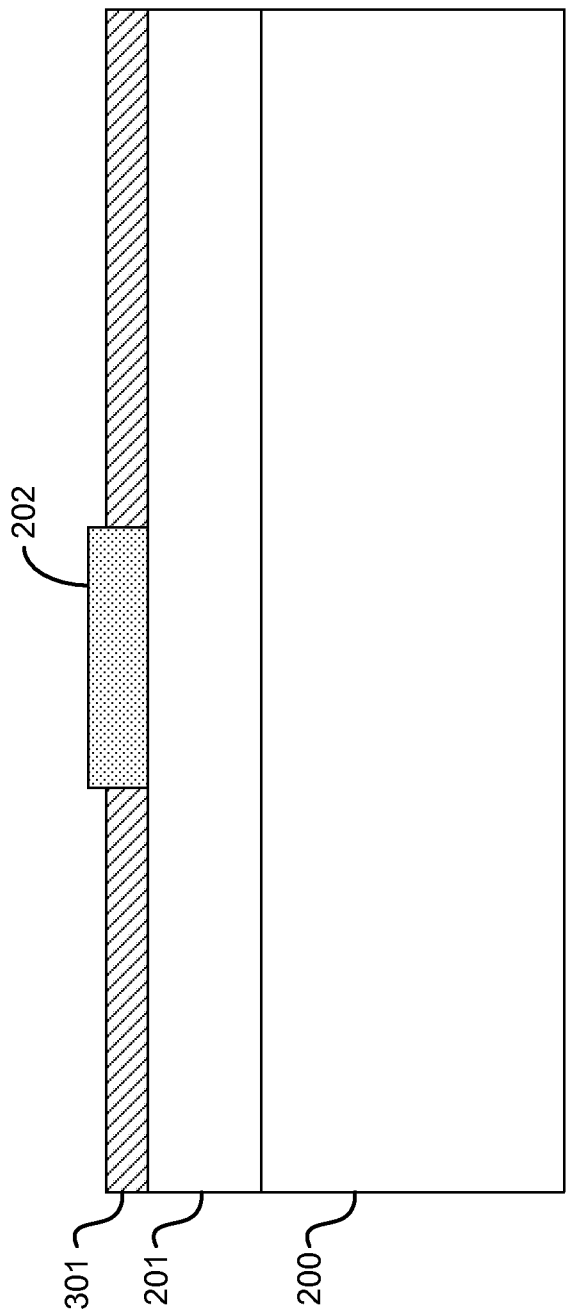

FIG. 3 illustrates the formation of a second GaN epitaxial layer 301 above the first GaN epitaxial layer 201. The second GaN epitaxial layer 301, from which portions or all of the edge termination structures are eventually formed, may have a conductivity type opposite the conductivity type of the first GaN epitaxial layer 201. For instance, if the first GaN epitaxial layer 201 is formed from an n-type GaN material, the second GaN epitaxial layer 301 will be formed from a p-type GaN material, and vice versa. The second GaN epitaxial layer 301 used to form elements of the edge termination structures is grown over portions of the first GaN epitaxial layer 201 that are not covered by regrowth mask 202. Second GaN epitaxial layer 301 is not formed over portions of first GaN epitaxial layer 201 that are covered by regrowth mask 202. This technique is referred to herein as selective epitaxial growth.

The thickness of the second GaN epitaxial layer 301 can vary, depending on the process used to form the layer and the device design. In some embodiments, the thickness of the second GaN epitaxial layer 301 is between 0.01 µm and 5 µm. In other embodiments, the thickness of the second GaN epitaxial layer 301 is between 0.3 µm and 1 µm.

The second GaN epitaxial layer 301 can be highly doped, for example in a range from about $1 \times 10^7$ cm$^{-3}$ to about $1 \times 10^{20}$ cm$^{-3}$. Additionally, as with other epitaxial layers, the dopant concentration of the second GaN epitaxial layer 301 can be uniform or non-uniform as a function of thickness. In some embodiments, the dopant concentration increases with thickness, such that the dopant concentration is relatively low near the first GaN epitaxial layer 201 and increases as the distance from the first GaN epitaxial layer 201 increases. Such embodiments provide higher dopant concentrations at the top of the second GaN epitaxial layer 301 where metal contacts can be subsequently formed. Other embodiments utilize heavily doped contact layers (not shown) to form Ohmic contacts.

One method of forming the second GaN epitaxial layer 301, and other layers described herein, can be through a regrowth process that uses an in-situ etch and diffusion preparation processes. These preparation processes are described more fully in U.S. patent application Ser. No. 13/198,666, filed on Aug. 4, 2011, the disclosure of which is hereby incorporated by reference in its entirety.

Figure 4:
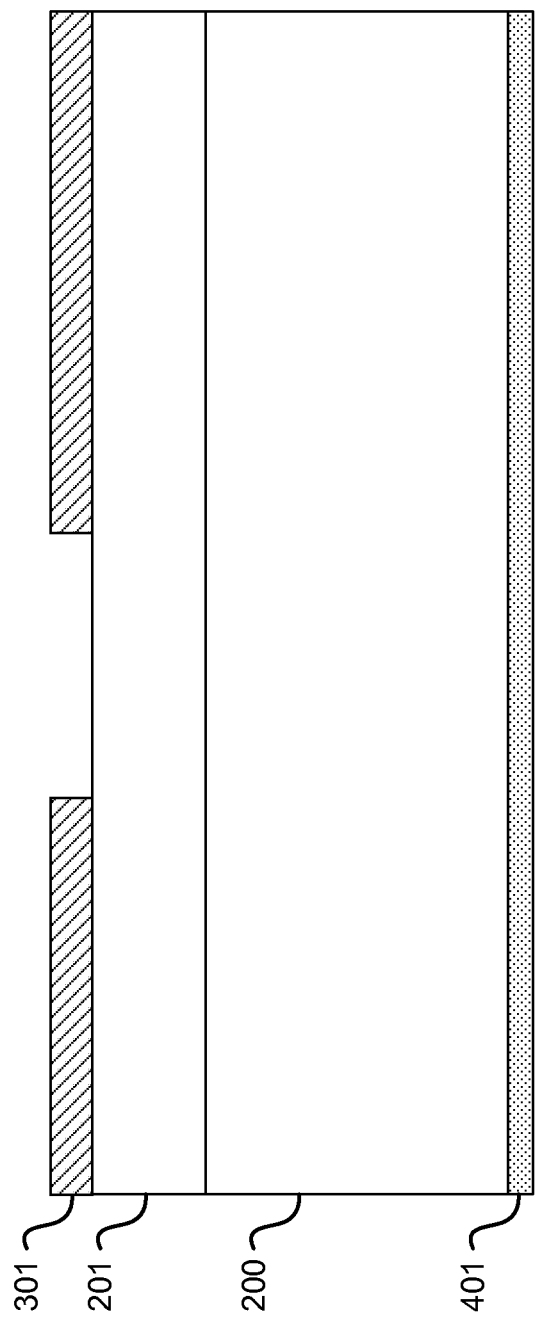

FIG. 4 illustrates the formation of a first metallic structure 401 below the GaN substrate 200. The first metallic structure 401 can be one or more layers of Ohmic metal that serve as an Ohmic contact for the cathode of the Schottky diode. For example, the metallic structure 401 can comprise a titanium-aluminum (Ti/Al) metal. Other metals and/or alloys can be used including, but not limited to, aluminum, nickel, gold, combinations thereof, or the like. In some embodiments, an outermost metal of the metallic structure 401 can include gold, tantalum, tungsten, palladium, silver, tin, aluminum, combinations thereof, and the like. The first metallic structure 401 can be formed using any of a variety of methods such as sputtering, evaporation, or the like. After first metallic structure 401 is formed, an optional heat treatment may be performed to improve the characteristics of the metal and/or the contact between the metal and the GaN substrate 200. For example, a rapid thermal anneal may be performed with a temperature in the range of 300° C. to 900° C. for a duration of one to ten minutes. In some embodiments, the ambient environment during the Rapid Thermal Anneal (RTA) may include nitrogen, hydrogen, oxygen, or a combination of these gases.

FIG. 4 further illustrates the removal of regrowth mask 202. In one embodiment, this layer is removed by wet etching or dry etching using one or more processing techniques. In some embodiments, the removal process is selected so that the underlying GaN surface is not substantially degraded by the removal process, such that the quality of the underlying material is not significantly compromised. For example, if regrowth mask 202 comprises silicon dioxide or silicon nitride, it may be removed by wet etching in a solution of hydrofluoric acid.

In another embodiment of this invention, regrowth mask 202 and the subsequent selective epitaxial growth process are replaced. In this embodiment, the structure illustrated in FIG. 4 is produced by blanket epitaxial growth of second GaN epitaxial layer 301, forming a masking layer that is the converse of masking layer 202, and etching away the portion of second GaN epitaxial layer 301 that is exposed by this mask.

Figure 5:
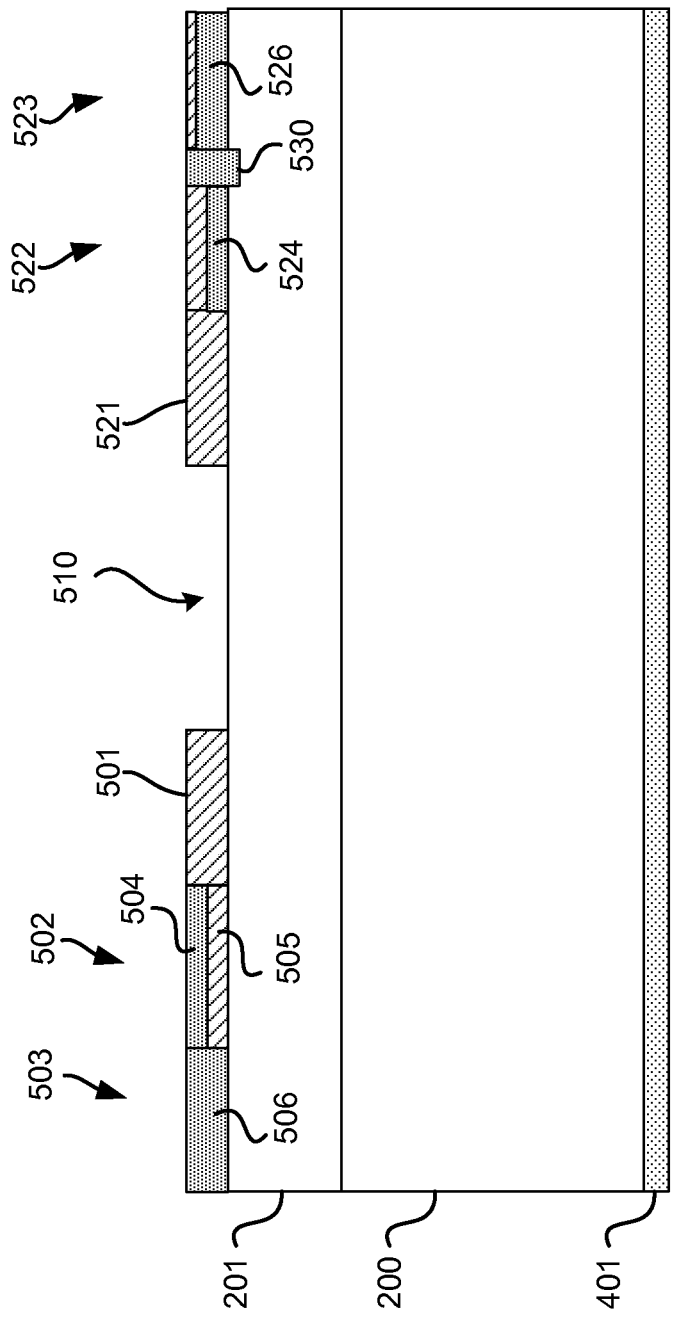

FIG. 5 is a simplified cross-sectional diagram illustrating ion implantation into portions of the second GaN epitaxial layer 301 to form a set of junction termination elements 501, 502, and 503, some or all of which can be utilized in fabricating a junction termination structure. As discussed in further detail below, junction termination elements 501, 502, and 503 can be used to form junction termination structures including any of a variety of structures, such as guard rings that circumscribe the active device (e.g., a Schottky diode) to provide for junction termination. Additionally, as illustrated in FIG. 5, a portion of the second GaN epitaxial layer 301 is not formed adjacent a portion of the first GaN epitaxial layer (due to selective epitaxial growth as discussed above), such that there is an exposed portion 510 of the first GaN epitaxial layer 201 in which the Schottky diode or other active elements can subsequently be formed. The ion implantation processes are performed through mask openings formed in a layer of photoresist, silicon dioxide, or other suitable masking materials (not shown).

The implanted ion species may be argon, nitrogen, helium, hydrogen or other appropriate species that reduce the electrical conductivity of implanted regions 504 and 506. Multiple implantations may be performed through the same mask opening, each implant being performed at a different energy, such that the implanted profiles extend deeper vertically, without a need to diffuse the dopants using a high temperature drive-in process. Thus, although the implanted regions are illustrated as a homogeneous material in FIG. 5, this is not required by the present invention and the implant dose can vary as a function of the thickness of the second GaN epitaxial layer as well as in the plane of the layer.

Embodiments of the present invention provide a plurality of regions that are characterized by differing electrical conductivity and can surround partially, or fully, a device region 510. This device region is suitable for use in the fabrication of active devices as described herein since a current path is provided through the epitaxial structure disposed below the exposed portion 510. In addition to the device region, other regions that are characterized by differing conductivities are provided, including intermediate conductivity region 502 and low conductivity region 503, which are illustrated and suitable for use in fabricating junction termination structures compatible with the active devices fabricated in the device region. One of ordinary skill in the art would recognize many variations, modifications, and alternatives.

The ion implantation process illustrated in FIG. 5 is designed to reduce the conductivity of the implanted region 504 and 506 to a predetermined level, effectively reducing the active charge of junction termination element 502 to a value less than that of junction termination element 501 and that of junction termination element 503 less than that of junction termination element 502. As illustrated in FIG. 5, a first ion implantation process is performed (e.g., a low energy implant) to decrease the conductivity of region 504 below that associated with the original epitaxial layer 301. As illustrated in FIG. 5, the depth of the implant used to decrease the conductivity of region 504 is less than the thickness of epitaxial layer 301, thereby providing a substantially unimplanted region 505. As a result, the junction termination element 502 provides a predetermined reduction in conductivity as a function of the implant dose, the implant depth, and the like. Region 505 is electrically connected to continuous region 501, providing for electrical conduction between the various junction termination elements, for example, 501 and 502.

A second ion implantation process is performed (e.g., a high energy implant) to decrease the conductivity of region 506 below that associated with junction termination element 502. In some embodiments, the second ion implantation process can share common processes with the first ion implantation process. As an example, the upper portion of region 506 could be implanted concurrently with region 504 and an additional implantation process (e.g., at a higher implant energy) could be used to implant the lower portion of region 506. Thus, although region 506 is illustrated as a layer with a homogeneous doping profile, this is not required by embodiments of the present invention. The various junction termination elements can be electrically connected to each other as illustrated by the adjacent elements in FIG. 5. In some embodiments, the region 506 is an isolation region characterized by a high resistivity. Thus, embodiments of the present invention provide for both junction termination elements and isolation elements, which can be fabricated using ion implantation, etching, selective regrowth, combinations thereof, or the like.

The junction termination structure formed by junction termination elements 501, 502, and 503 in FIG. 5 provides a decrease in conductivity as the distance from the active device increases. The parameters utilized during the ion implantation processes can selected to provide a desired conductivity profile as a function of position, analogous to a linear or nonlinear decrease in conductivity vs. distance. The net effect is that junction termination structure formed by 501, 502 and 503 provides a decrease in net active charge which is the product of active dopants and active thickness. The ion implantation processes provide methods to modulate the net active charge. In some embodiments, the net active charge in the junction termination elements ranges from about $1 \times 10^{12}$ cm$^{-2}$ to about $1 \times 10^{14}$ cm$^{-2}$, for example, a first junction termination element with net active charge of $1 \times 10^{13}$ cm$^{-2}$ and a second junction termination element with net active charge of $3 \times 10^{12}$ cm$^{-2}$. Additionally, multiple implantation processes can be used to form each of the implanted regions (e.g., region 504 or region 506), with, increasing, decreasing, modulated, or substantially constant doping concentration as a function of depth. One of ordinary skill in the art would recognize many variations, modifications, and alternatives.

Referring once again to FIG. 5, junction termination elements 521, 522, and 523 are illustrated and may be alternatives to junction termination elements 501, 502, and 503 or used in conjunction therewith. Thus, the various structures illustrated in FIG. 5 are provided as exemplary configurations are not intended to limit embodiments of the present invention. The junction termination element 522 includes region 524 that is characterized by reduced conductivity and is placed near the bottom of second epitaxial layer 301, as opposed to region 504 that is placed near the top of second epitaxial layer 301. Region 524 is produced using a higher energy implant than that used to implant region 504. Region 526 has a larger vertical extent than region 524 such that the conductivity of junction termination element 523 is lower than the conductivity of junction termination element 522.

Junction termination elements 522 and 523 are electrically isolated by electrically insulating implanted region 530 that electrically isolates these portions or regions of the second GaN epitaxial layer 301. The ion implantation process(es) used to form insulating implanted region 530 shares common features with the implantation processes discussed above. The implanted ion species may be argon, nitrogen, helium, hydrogen or other appropriate species that produce the electrically insulating implanted region 530. Multiple implantations may be performed through the same mask opening, each implant being performed at a different energy, such that the implanted profiles extend deeper vertically, without a need to diffuse the dopants using a high temperature drive-in process. Thus, although the implanted region 530 is illustrated as a homogeneous material in FIG. 5, this is not required by the present invention and the implant dose can vary as a function of the thickness of the second GaN epitaxial layer as well as in the plane of the layer.

In one embodiment and as an example of processes utilized to fabricate one or more of the implanted regions illustrated in FIG. 5, three nitrogen implantations may be performed with first, second, and third implantation energies of about 20 to 60 keV, about 80 to 200 keV, and about 300 to 500 keV, respectively. These nitrogen implant doses may be in the range of $1 \times 10^{12}$ to $1 \times 10^{16}$ cm$^{-2}$. The first nitrogen implantation (with appropriate masking) is used to form regions 504 and the upper portions of regions 506 and 526. The second nitrogen implantation is used to form region 524 and the lower portion of regions 506 and 526. The third nitrogen implantation is used to extend electrically insulating implanted region 530 into the underlying first GaN epitaxial layer 201. One of ordinary skill in the art would recognize many variations, modifications, and alternatives.

In another embodiment, argon may be implanted with doses in the range of $1 \times 10^{12}$ to $5 \times 10^{16}$ cm$^{-2}$. In the embodiment illustrated in FIG. 5 to fabricate electrically insulating implanted region 530, the vertical depth of the implanted regions is greater than or equal to the vertical thickness of second GaN epitaxial layer 301. Thus, in some embodiments, the electrically insulating implanted region 530 extends into the first GaN epitaxial layer by a predetermined distance. After the ion implantation process(es), an optional high-temperature anneal may be performed to activate the implanted ions and/or repair damage in the GaN material which may be introduced by the ion implantation.

Figure 6:
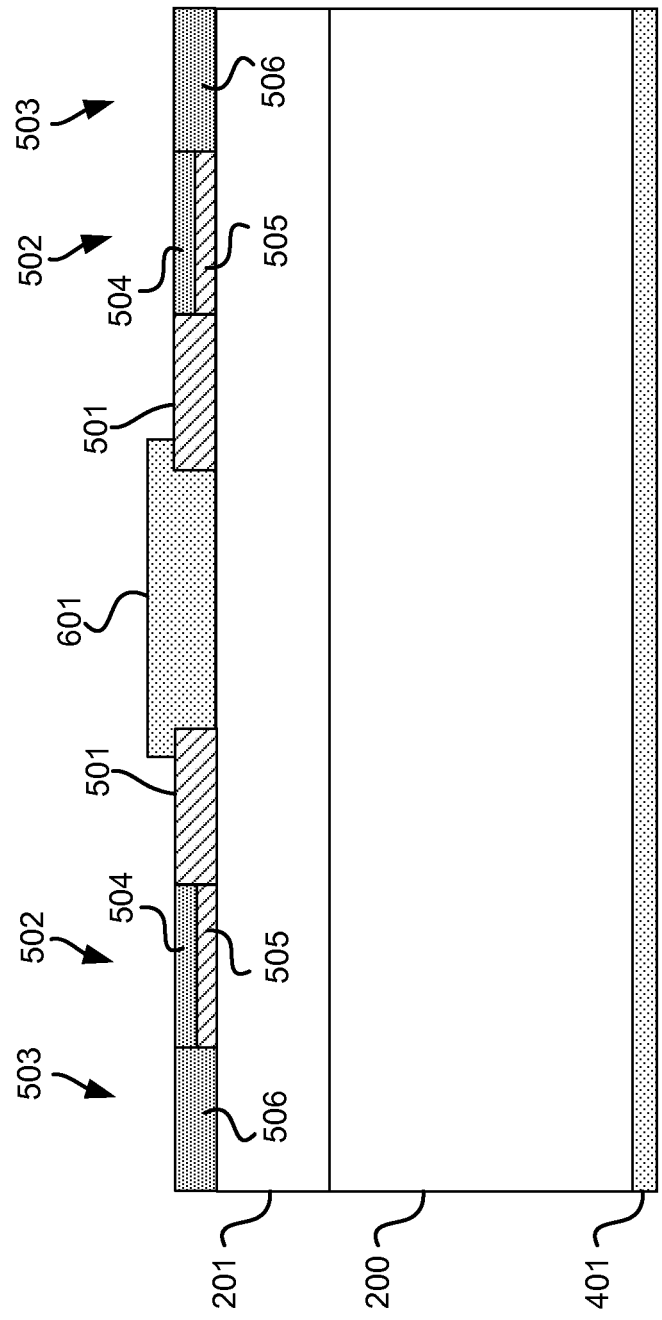

FIG. 6 illustrates the formation of a second metallic structure 601 coupled to the exposed portion 510 of the first GaN epitaxial layer 201. For purposes of clarity, the junction termination structure illustrated on the left portion of FIG. 5 is utilized symmetrically in FIG. 6. The second metallic structure 601 can be one or more layers of metal and/or alloys to create a Schottky barrier with the first GaN epitaxial layer 201, and the second metallic structure 601 further can overlap portions of the junction termination elements 501 and 521 (which may form first elements of an edge termination structure). The second metallic structure 601 can be formed using a variety of techniques, including lift-off and/or deposition with subsequent etching, which can vary depending on the metals used. In some embodiments, the contact metal structure 601 can include nickel, platinum, palladium, silver, gold, and the like. In some embodiments, the second metallic structure 601 makes an Ohmic contact with the p-type material in epitaxial layer 301 so that in reverse bias, portions of epitaxial layer 301 extend the field laterally. One of ordinary skill in the art would recognize many variations, modifications, and alternatives.

Figure 7A:
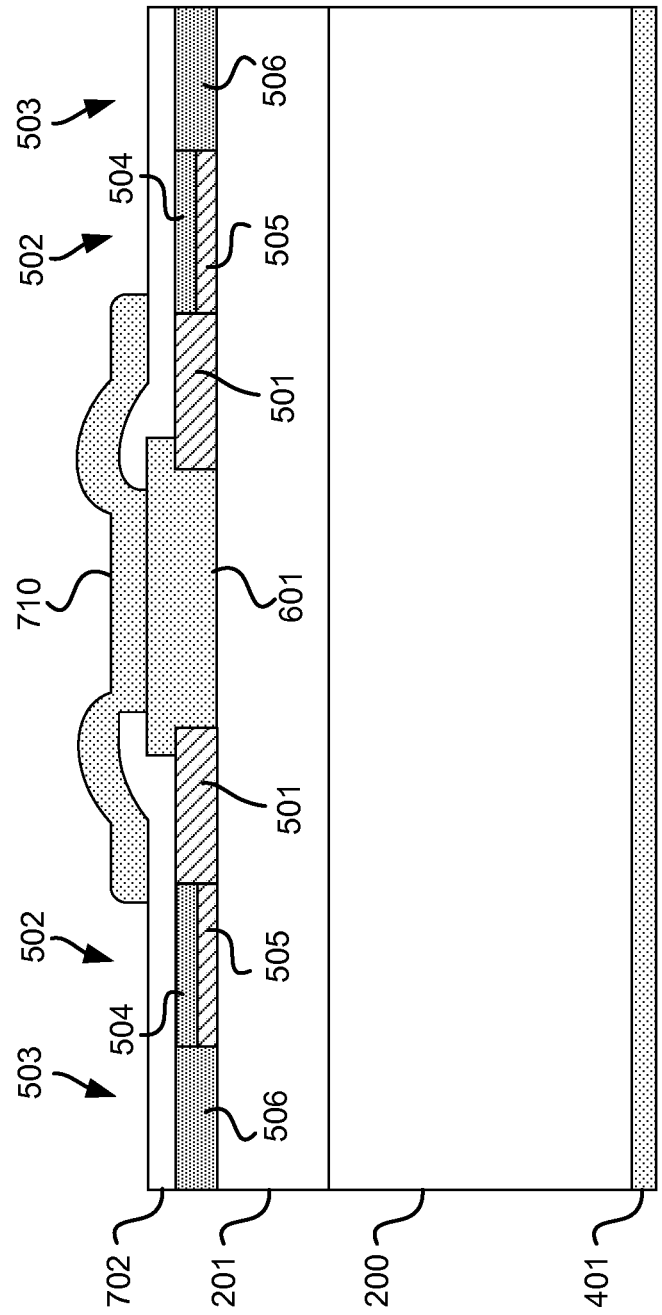

FIG. 7A illustrates the formation of metallic field plate 710 coupled to metallic structure 601 and to dielectric layer 702 (e.g., an inter-layer dielectric), which may also provide some passivation functionality. The metallic field plate 710 can be formed after dielectric layer 702 is deposited and patterned. The pattern can be formed by a controlled etch using a etch mask (not shown but patterned to expose the metallic structure 601). In alternative embodiments, the metallic field plate 710 can be located on or above one or multiple reduced conductivity regions 501, 502, and 503 used in forming the junction termination structures. One of ordinary skill in the art would recognize many variations, modifications, and alternatives.

Figure 7B:
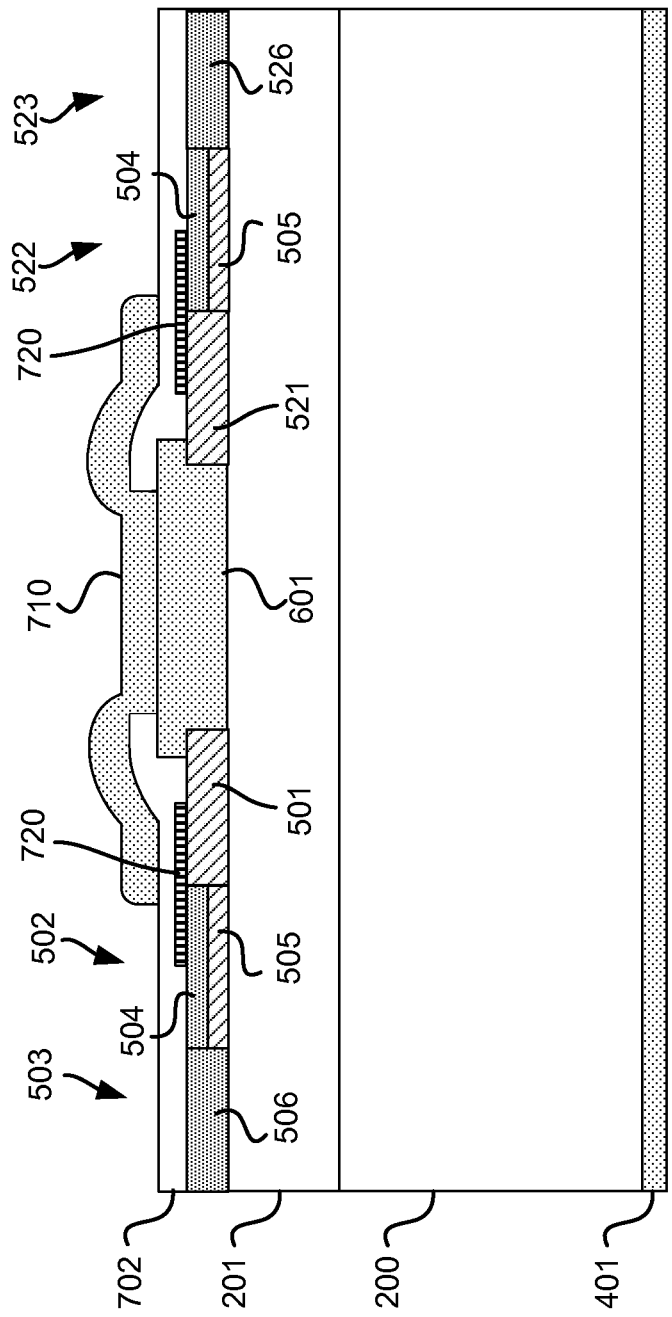
FIG. 7B is a simplified cross-sectional diagram illustrating the Schottky diode shown in FIG. 7A with optional floating field plates according to an embodiment of the present invention.

FIG. 7B is a simplified cross-sectional diagram illustrating the Schottky diode shown in FIG. 7A with optional floating field plates according to an embodiment of the present invention. Referring to FIG. 7B, optional floating field plates 720 are integrated into the structure. Additional electrical coupling is provided by the connection between the floating field plate 720 and the junction termination elements. The floating field plate can share common features and materials with the second metallic structure 601 and/or metallic field plate 710 and can be fabricated using common steps with the second metallic structure 601. As will be appreciated, the floating field plate provides for additional coupling of fields associated with junction termination element 501 to locations more distant from the active device. One of ordinary skill in the art would recognize many variations, modifications, and alternatives.

Figure 7C:
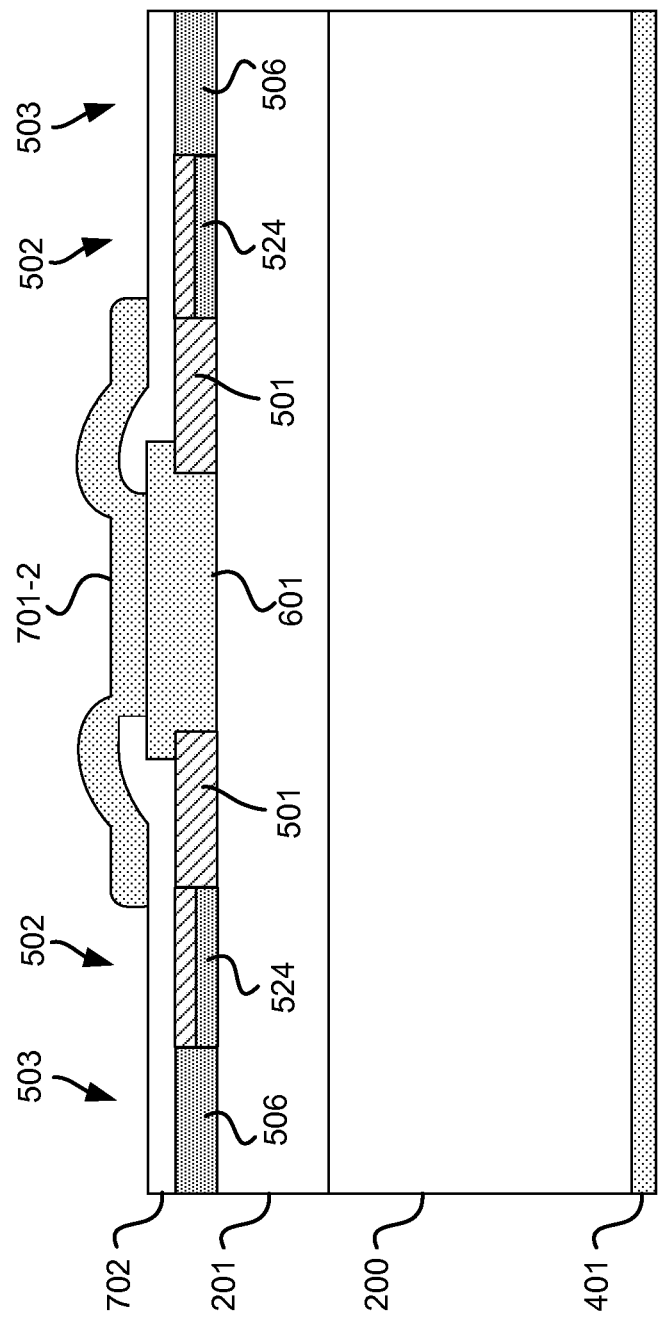
FIG. 7C illustrates an alternative embodiment of the Schottky diode shown in FIG. 7A.

FIG. 7C illustrates an alternative embodiment of the Schottky diode shown in FIG. 7A. The embodiment illustrated in FIG. 7C utilizes implanted region 524 as illustrated in FIG. 5, which provided reduced conductivity in a lower portion of epitaxial layer 301. As described in relation to FIG. 5, an ion implantation with a higher energy can be utilized to form these implanted, reduced conductivity regions 524 underlying other portions of the epitaxial layer with higher conductivity. Thus, different implant profiles can be utilized to provide the differing conductivity regions utilized according to embodiments of the present invention. One of ordinary skill in the art would recognize many variations, modifications, and alternatives.

Although some embodiments are discussed in terms of GaN substrates and GaN epitaxial layers, the present invention is not limited to these particular binary III-V materials and is applicable to a broader class of III-V materials, in particular III-nitride materials. Additionally, although a GaN substrate is illustrated in FIG. 2, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

Figure 17:
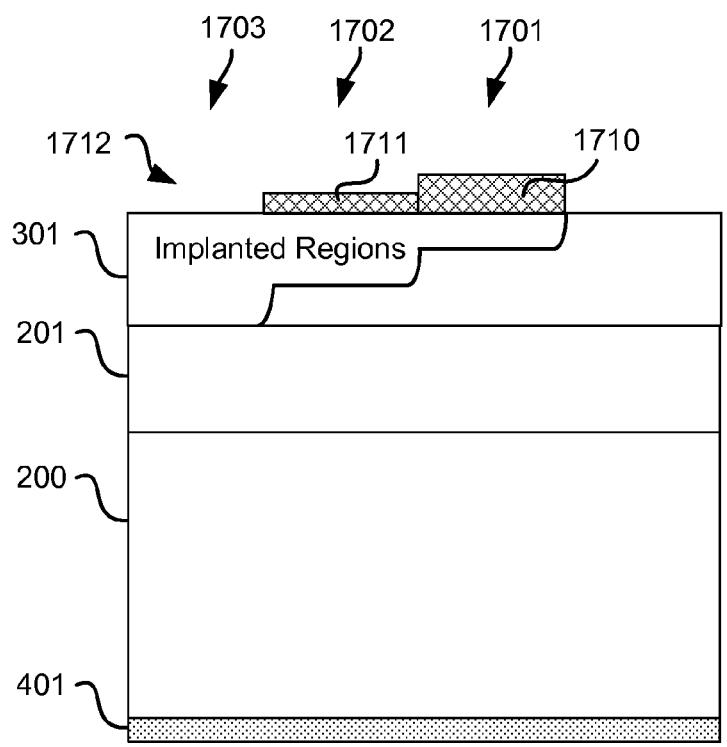
FIG. 17 is a simplified schematic diagram illustrating a masking structure associated with producing differing conductivity regions according to an embodiment of the present invention.

FIG. 17 is a simplified schematic diagram illustrating a masking structure associated with producing differing conductivity regions according to an embodiment of the present invention. The structure illustrated in FIG. 17 can be used in an alternative fabrication process to fabricate the regions with differing conductivity. Referring to FIG. 17, a mask structure includes a region 1710 having a first thickness, a region 1711 having a second thickness less than the first thickness, and a region 1712 with no mask. An ion implantation process can be performed using this mask to create regions 1701, 1702, and 1703 with differing implant profiles as shown. In the area covered by the thicker mask 1710, the implantation profile will be shallower than in the area having no mask. Accordingly, the regions 1701, 1702, and 1703 will have differing conductivities, providing junction termination elements as described herein.

Figure 18:
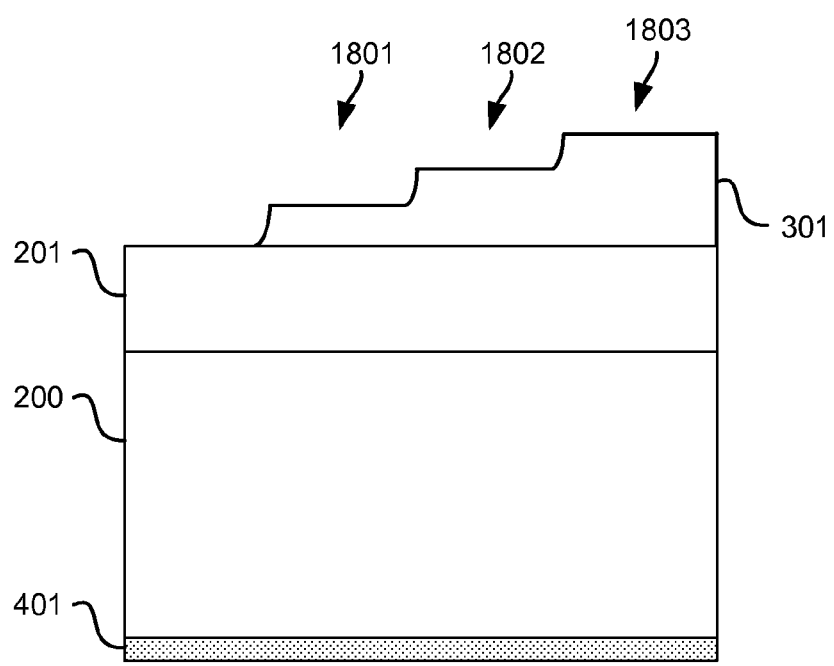
FIG. 18 is a simplified schematic diagram illustrating an etched junction termination structure according to an embodiment of the present invention.

FIG. 18 is a simplified schematic diagram illustrating an etched junction termination structure according to an embodiment of the present invention. In the embodiment illustrated in FIG. 18, a three-level etch process has been utilized to create regions 1801, 1802, and 1803 with differing conductivity and net active charge characteristics as a result of removing portions of the second epitaxial layer 301. One of ordinary skill in the art would recognize many variations, modifications, and alternatives.

The fabrication process illustrated in FIGS. 2-7A utilizes a process flow in which an n-type drift layer is grown using an n-type substrate. However, the present invention is not limited to this particular configuration. In other embodiments, substrates with p-type doping are utilized. Additionally, embodiments can use materials having an opposite conductivity type to provide devices with different functionality. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

Figure 8A:
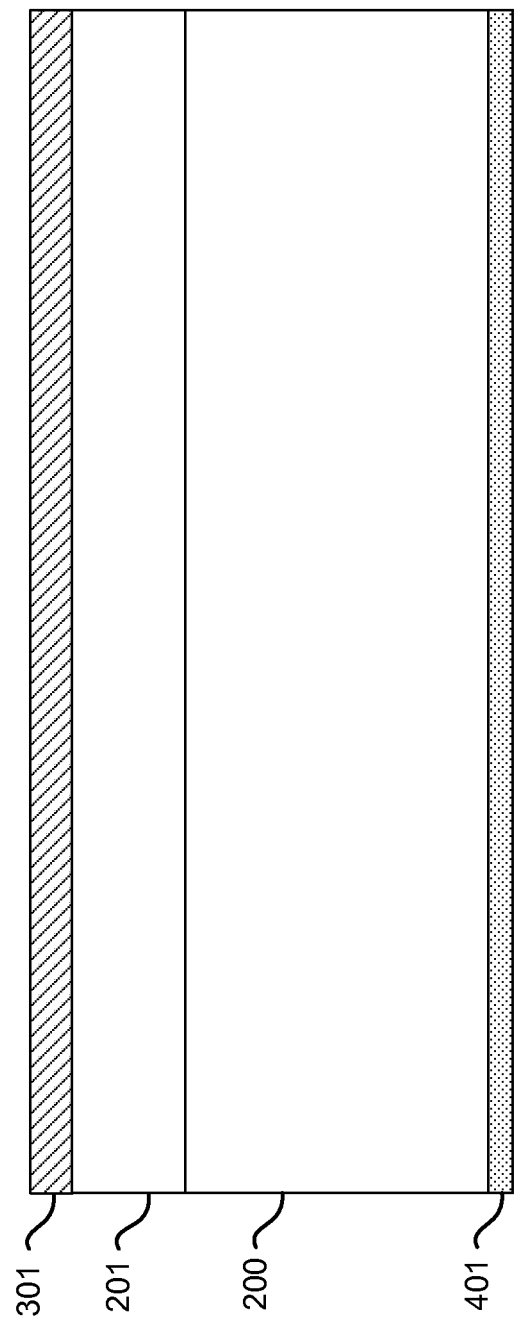

FIGS. 8A-10A illustrate a process for creating a PN diode in GaN with junction termination structures formed using ion implantation to isolate different regions of an epitaxial layer. The process can begin with the same steps of providing a GaN substrate 200 and a first GaN epitaxial layer 201. A second GaN epitaxial layer 301 is formed over the entire top surface of first GaN epitaxial layer 201 and a first metallic structure 401 is formed on the bottom of substrate 200, as shown in FIG. 8A. The structure properties, such as dopant concentrations and thicknesses, can vary from those of a Schottky diode, depending on the desired functionality.

Figure 8B:
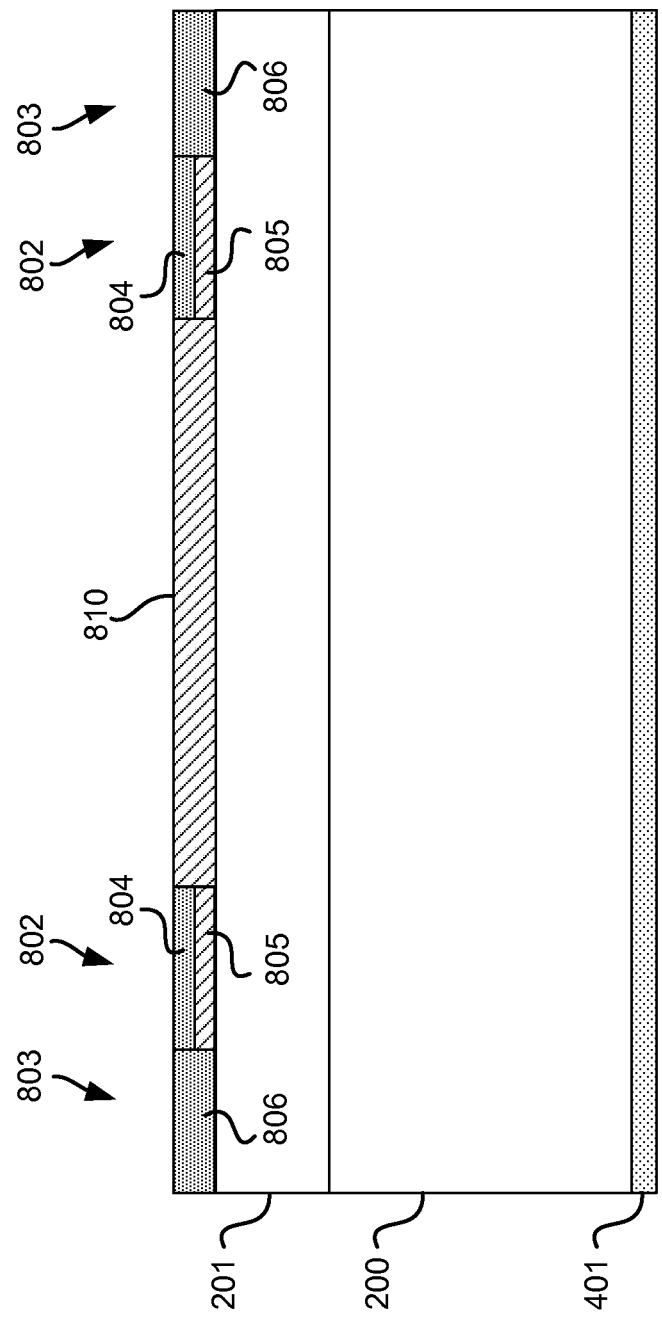

FIG. 8B illustrates ion implantation into portions of the second GaN epitaxial layer 301 (and into portions of the first GaN epitaxial layer 201 in some embodiments) to form junction termination structures 802 and 803 configured to provide junction termination to the PN diode that is subsequently fabricated. Additionally, as illustrated in FIG. 8B, at least a portion of the second GaN epitaxial layer 301 is left unimplanted, forming a device region 810 that is utilized in fabricating the PN diode. For example, in one embodiment, the device region 810 can have a p+ conductivity type, the first GaN epitaxial layer 201 can have a n− conductivity type, and the GaN substrate 200 can have an n+ conductivity type, forming the PN layers of the PN diode. Details of the ion implantation as discussed in reference to FIG. 5 above are applicable with respect to FIG. 8B. As discussed in relation to FIG. 5, implanted regions 804 and 806 can have various implant profiles resulting in a predetermined conductivity for each of the junction termination structures 802 and 803.

Figure 9:
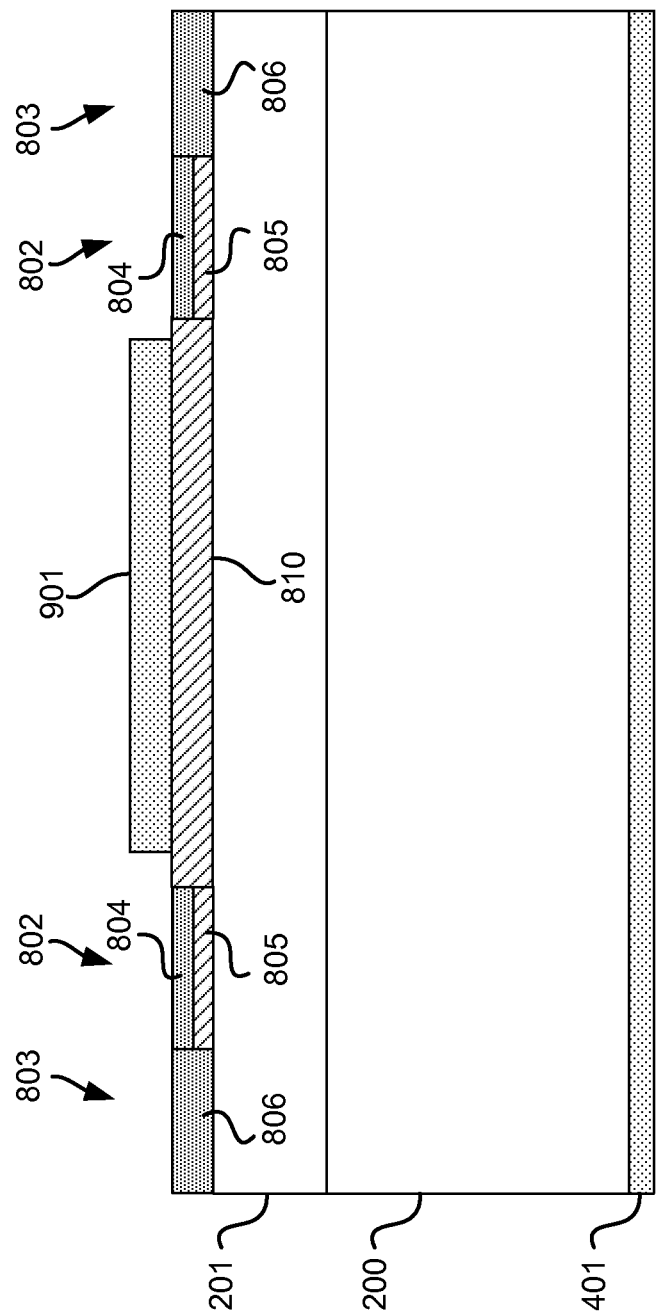

FIG. 9 illustrates the formation of a second metallic structure 901 (in addition to the metallic structure 401) electrically coupled to at least a portion of the device region 810. The second metallic structure 901 can serve as an electrical contact (e.g., an anode) for the PN diode. In one embodiment, second metallic structure 901 is formed of different materials than those used to form first metallic structure 401. For example, the materials used for second metallic structure 901 may be selected to optimize the Ohmic contact to the p-type material in device region 810, while the materials used for first metallic structure 401 may be selected to optimize the Ohmic contact to GaN substrate 200. After second metallic structure 901 is formed, an optional heat treatment may be performed to improve the characteristics of the metal and/or the contact between the metal and device region 810. For example, a rapid thermal anneal may be performed with a temperature in the range of 300° C. to 900° C. for a duration of one to ten minutes. In some embodiments, the ambient environment during the RTA may include nitrogen, hydrogen, oxygen, or a combination of these gases.

While this embodiment is described in terms of a PN diode, a PIN (P-type, intrinsic, N-type) diode may be formed in a similar manner. By way of example, a PN diode may comprise N-type doping in the first GaN epitaxial layer and P-type doping in the second GaN epitaxial layer. A PIN diode, may comprise a very resistive first GaN epitaxial layer (i.e. lightly doped N-type or P-type, nearly the same resistivity as intrinsic, or undoped, GaN) and a P-type second GaN epitaxial layer.

Figure 10A:
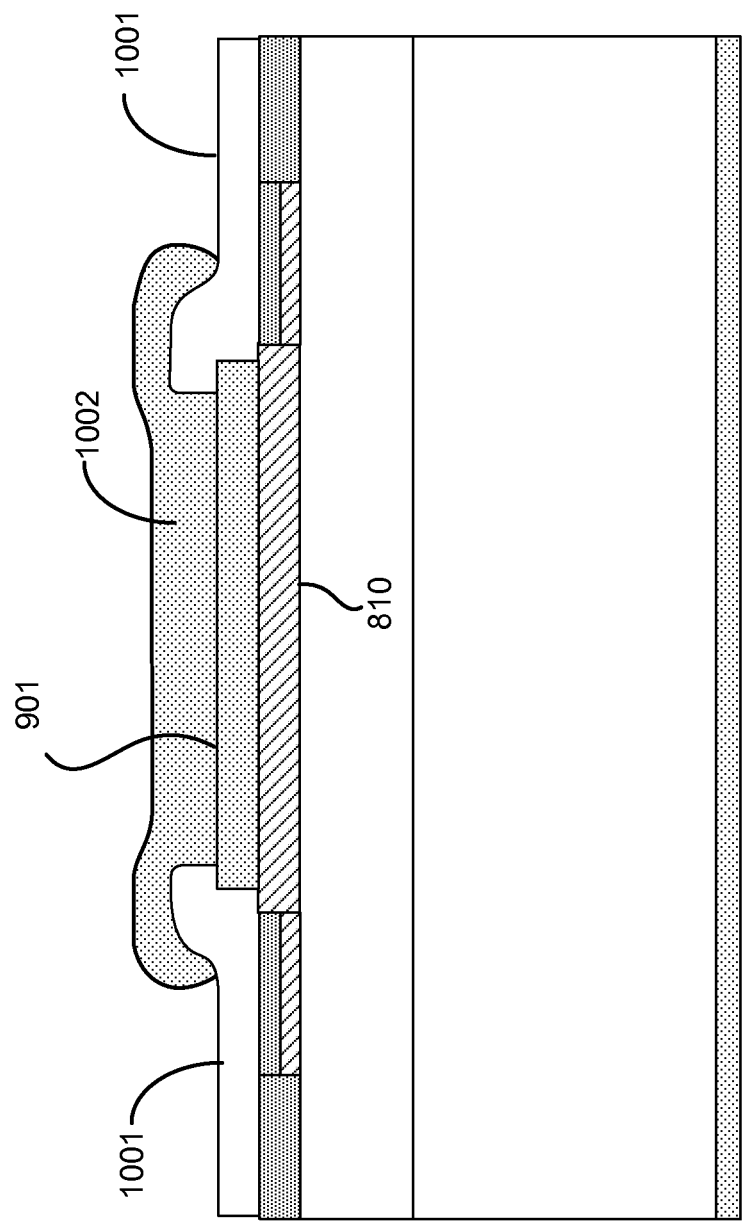

FIG. 10A illustrates the formation of metallic field plate 1002 coupled to metallic structure 901 and dielectric layer 1001. The metallic field plate 1002 can be formed after dielectric layer 1001 is deposited and patterned. The pattern can be formed by a controlled etch using a etch mask (not shown but patterned to expose the metallic structure 901). In alternative embodiments, the metallic field plate 1002 can be located on or over one or multiple junction termination structures formed using implanted regions 802 and 803. One of ordinary skill in the art would recognize many variations, modifications, and alternatives.

Figure 10B:
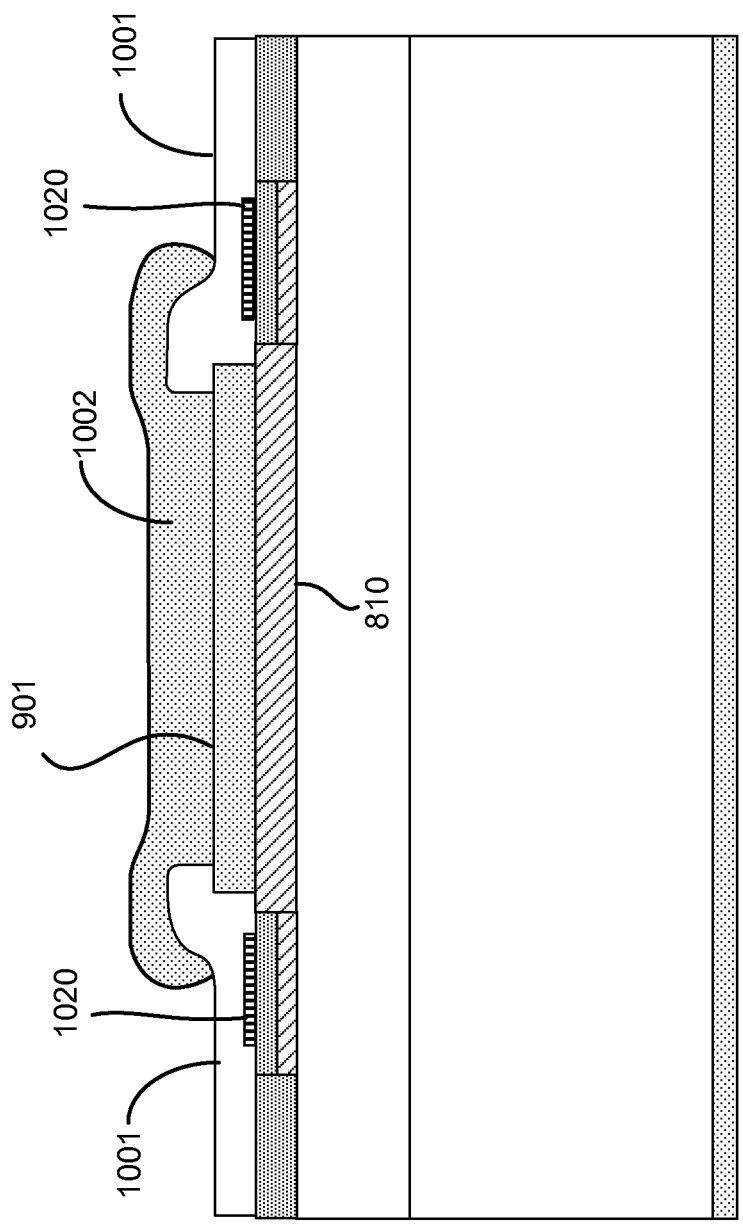
FIG. 10B is a simplified cross-sectional diagram illustrating the PN diode shown in FIG. 10A with optional floating field plates according to an embodiment of the present invention.

FIG. 10B is a simplified cross-sectional diagram illustrating the PN diode shown in FIG. 10A with optional floating field plates according to an embodiment of the present invention. Referring to FIG. 10B, optional floating field plates 1020 are integrated into the structure. Additional electrical coupling is provided by the connection between the floating field plate 1020 and the junction termination elements. The floating field plate can share common features with the metallic structure 901 and/or metallic field plate 1002. As will be appreciated, the floating field plate provides for additional coupling of fields associated with the junction termination element(s) to locations more distant from the active device. One of ordinary skill in the art would recognize many variations, modifications, and alternatives.

Figure 10C:
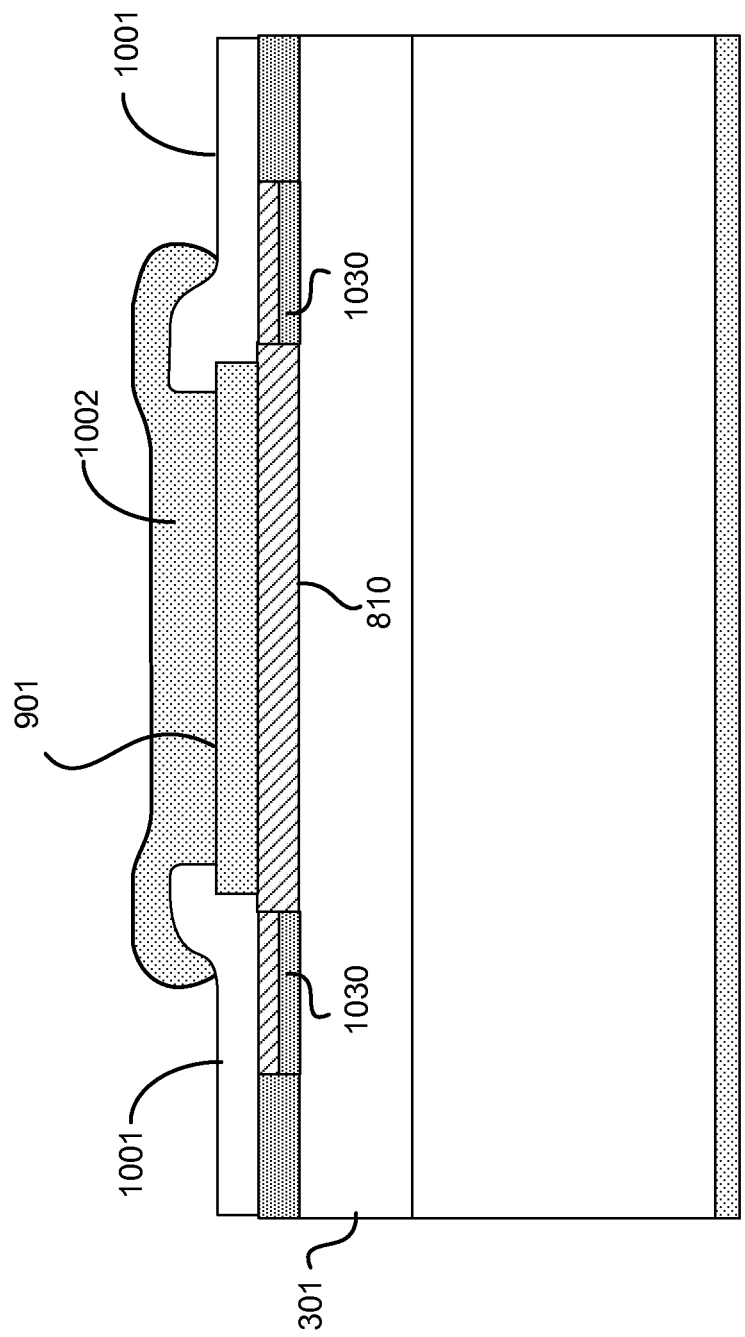
FIG. 10C illustrates an alternative embodiment of the PN diode shown in FIG. 10A.

FIG. 10C illustrates an alternative embodiment of the PN diode shown in FIG. 10A. The embodiment illustrated in FIG. 10C utilizes implanted region 1030 to provide reduced conductivity in a lower portion of epitaxial layer 201. As described above, an ion implantation with a higher energy can be utilized to form these implanted, reduced conductivity regions 1030 underlying other portions of the epitaxial layer with higher conductivity. Thus, different implant profiles can be utilized to provide the differing conductivity regions utilized according to embodiments of the present invention. One of ordinary skill in the art would recognize many variations, modifications, and alternatives.

Figure 11:
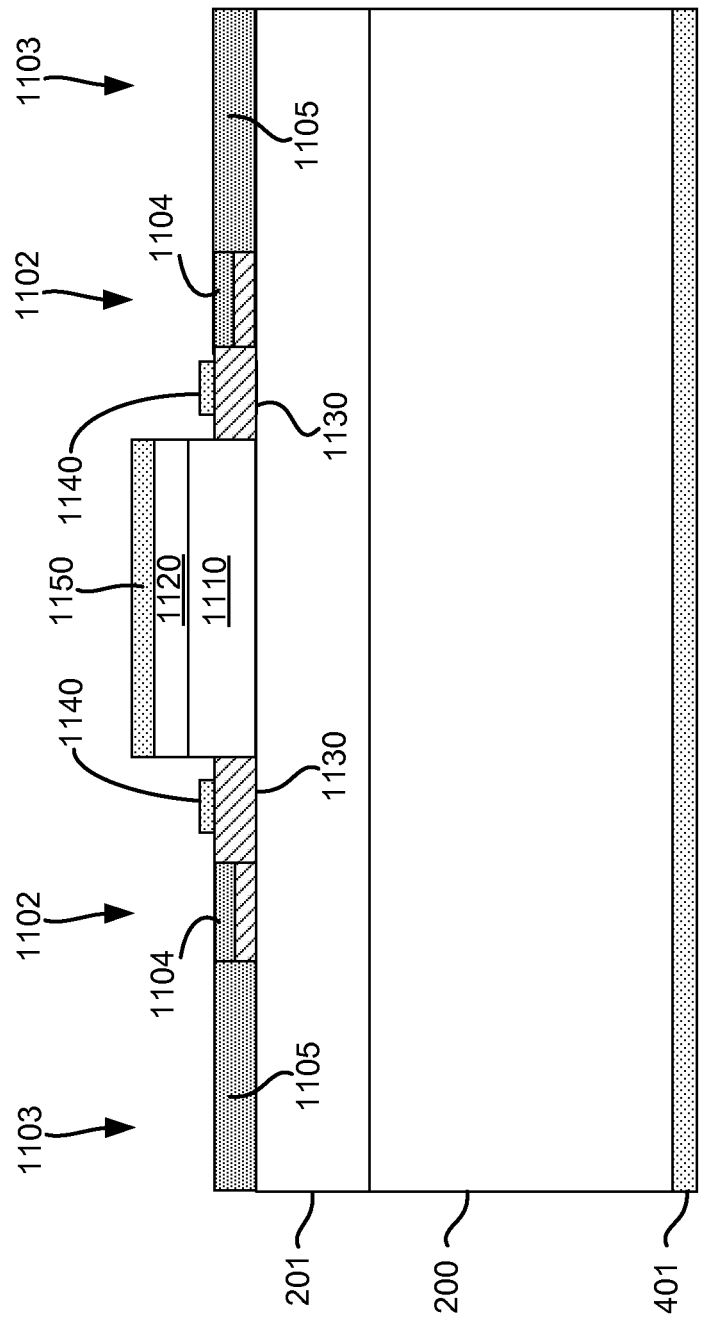
FIG. 11 is simplified cross-sectional diagram illustrating a vertical JFET with junction termination structures according to another embodiment of the present invention.

FIG. 11 is a simplified cross section of a vertical JFET with junction termination structures 1102 and 1103, which can be formed using epitaxial regrowth and ion implantation, as described herein. The vertical JFET can include a GaN substrate 200, first GaN epitaxial layer 201, and first metallic structure 401, similar to those in the structures discussed previously. Here, first metallic structure 401 can function as a drain contact of the vertical JFET. Additionally, the JFET can include a channel region 1110, which can be formed through epitaxial regrowth and have a low dopant concentration similar to the first GaN epitaxial layer 201, having the same conductivity type. Furthermore, a source region 1120 can be formed from an epitaxial layer of the same conductivity type as the channel region 1110 and the first GaN epitaxial layer 201. Gate regions 1130 can be formed from the same epitaxial growth or regrowth as the edge termination structures 1102 and 1103, which has an opposite conductivity type as the first GaN epitaxial layer 201. Junction termination structures 1102 and 1103 are characterized by differing conductivities as a result of the ion implantation into regions 1104 and 1105. Finally, Ohmic metal contacts 1140 and 1150 can be provided on the gate regions 1130 and the source region 1120 to provide gate and source contacts, respectively. Metal contacts 1140 and 1150 may comprise different materials, each optimized to provide Ohmic contact to the gate and source regions.

For example, in some embodiments, the GaN substrate 200 can have an n+ conductivity type with dopant concentrations ranging from $1 \times 10^{17}$ cm$^{-3}$ to $1 \times 10^{19}$ cm$^{-3}$, and the first GaN epitaxial layer 201 can have a n− conductivity type, with dopant concentrations ranging from $1 \times 10^{14}$ cm$^{-3}$ to $1 \times 10^{18}$ cm$^{-3}$. The thickness of the first GaN epitaxial layer 201 can be anywhere from 0.5 µm and 100 µm or over 100 µm, depending on desired functionality and breakdown voltage. The channel region 1110, which can have a n− conductivity type with a dopant concentration similar to the first GaN epitaxial layer 201, can be anywhere from between 0.1 µm and 10 µm thick, and the width of the channel region 1110 (i.e., the distance between gate regions 1130) for a normally-off vertical JFET can be between 0.5 µm and 10 µm. For a normally-on vertical JFET, the width of the channel region 1110 can be greater. The source region 1120 can have a thickness of between 500 Å and 5 µm and an n-type conductivity with a dopant concentration equal to or greater than $1 \times 10^{18}$ cm$^{-3}$. The gate regions 1130 and the junction termination structures 1102 and 1103 can be from 0.1 µm and 5 µm thick and have a p+ conductivity type with dopant concentrations in a range from about $1 \times 10^{17}$ cm$^{-3}$ to about $1 \times 10^{20}$ cm$^{-3}$.

Figure 12:
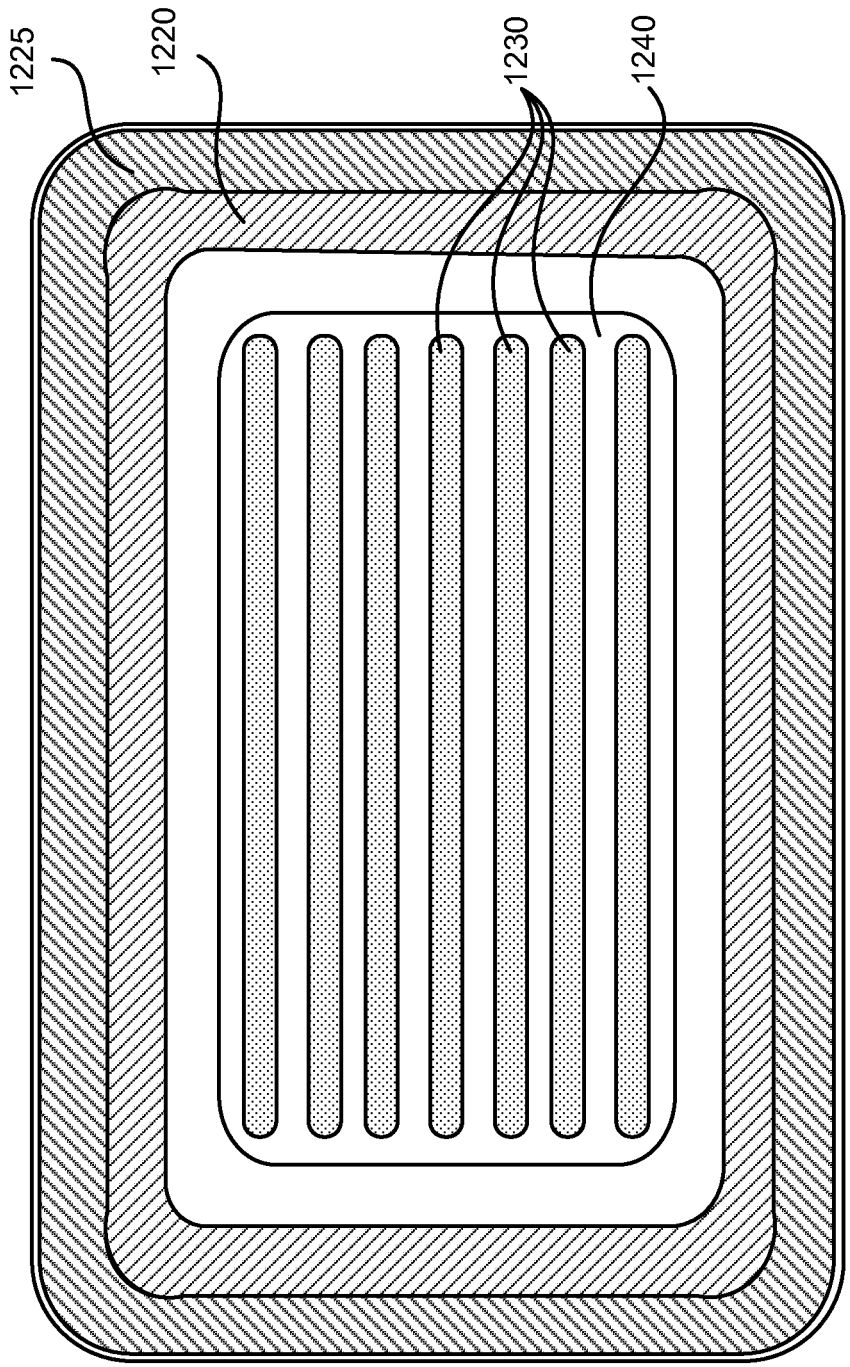
FIGS. 12-14 are simplified top-view illustrations showing different example embodiments of junction termination structures according to embodiments of the present invention.
Figure 13:
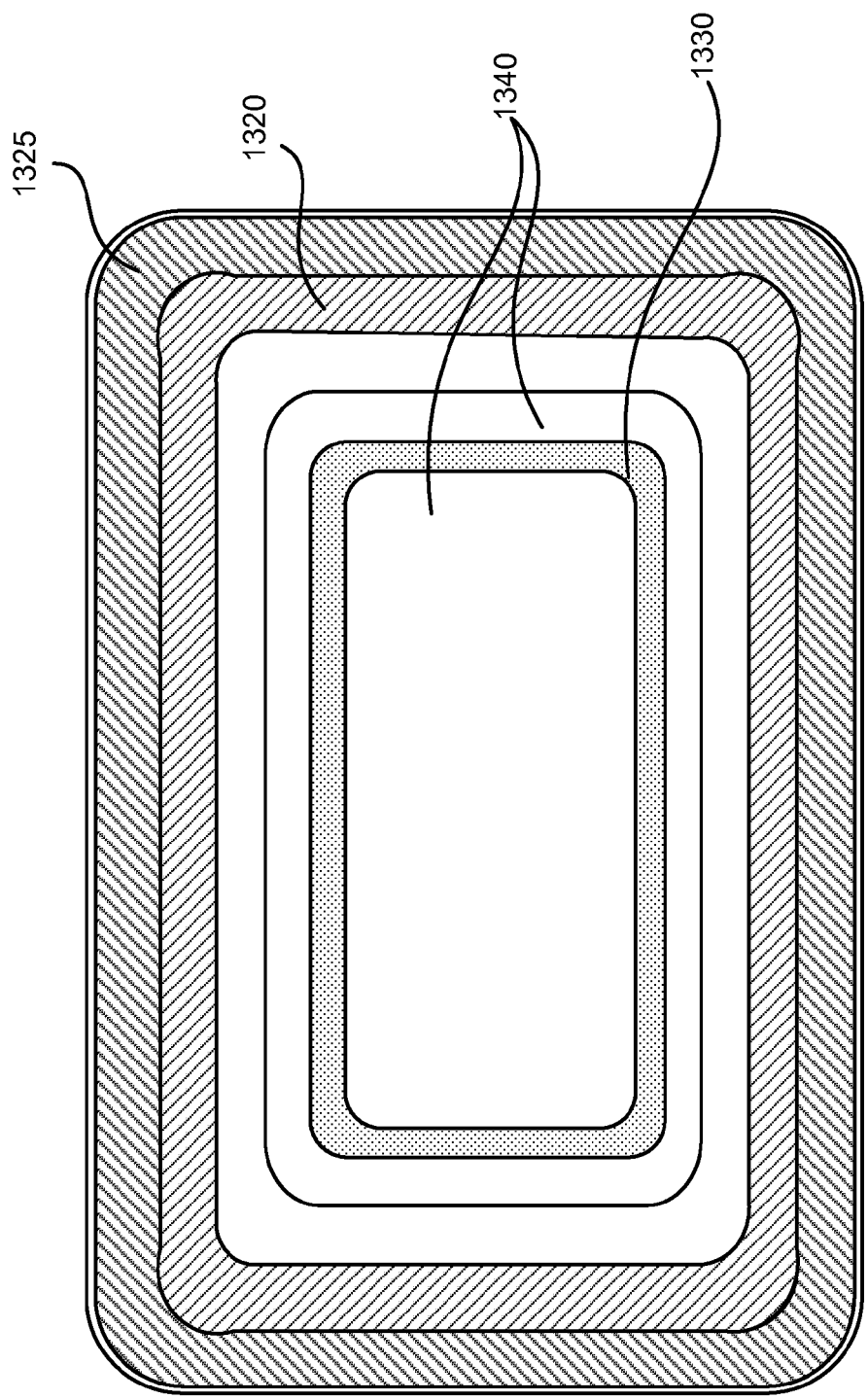
Figure 14:
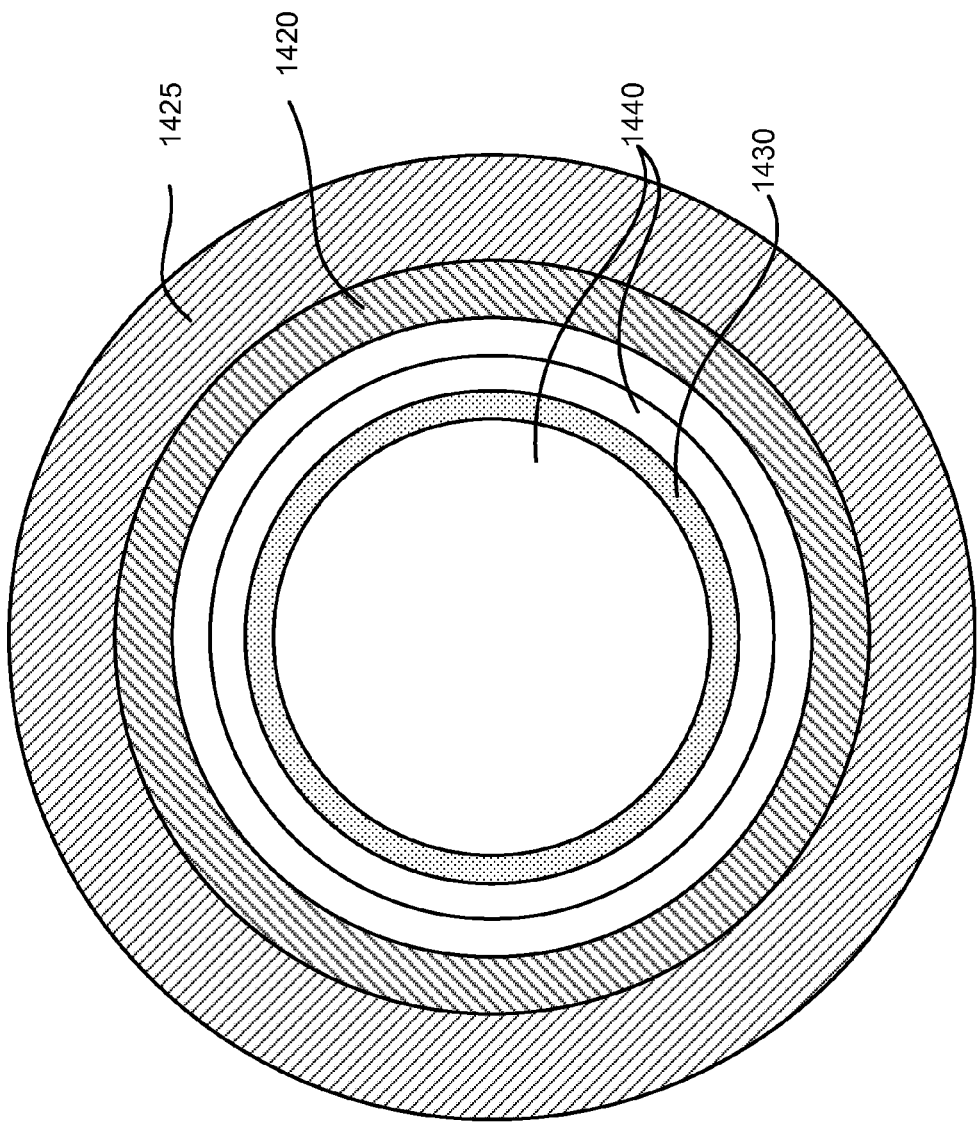

As demonstrated above, the junction termination structures described herein can provide junction or edge termination to a variety of types of semiconductor devices. FIGS. 12-14 are simplified top-view illustrations that provide some example embodiments.

FIG. 12 illustrates a top view of an embodiment of a transistor structure (e.g. the vertical JFET of FIG. 11) with a junction termination structure comprising two junction termination elements 1220. In this embodiment, the junction termination elements 1220 and 1225 and gate structure 1240 can be fabricated in a p+ GaN epitaxial material formed on an underlying drift region (not shown) comprising an n− GaN epitaxial layer. Multiple source regions 1230 can be made of a n+ GaN epitaxial material formed on n− GaN epitaxial channel regions located between the gates. Junction termination elements 1220 and 1225 may be fabricated using the same p-type epitaxial layer. As discussed above, the junction termination elements 1220 and 1225 having differing conductivities as a result of successive ion implantation processes, providing for junction termination of the active elements circumscribed by the junction termination elements. In an embodiment, one or more first implant processes are used to provide a junction termination element 1220 and a final implant process is used to provide for device isolation via junction termination element 1225.

FIG. 13 illustrates another embodiment of a transistor structure with junction termination provided by two guard rings 1320 and 1325. Similar to the embodiment shown in FIG. 12, the junction termination elements 1320 and 1325 and gate structure 1340 can be fabricating using a p+ GaN epitaxial material formed on an underlying drift region (not shown) comprising an n− GaN epitaxial layer. A source region 1330 can be made of an n+ GaN epitaxial material formed on n− GaN epitaxial channel region located between the gates formed from the gate structure 1340.

FIG. 14 illustrates yet another embodiment of a transistor structure similar to the embodiment shown in FIG. 13, illustrating how junction termination structures 1420 and 1425 can be shaped differently to accommodate differently-shaped semiconductor structures. Again, guard rings 1420 and 1425 and gate structure 1440 can be fabricated using a p+ GaN epitaxial material formed on a drift region 1410 comprising an n− GaN epitaxial layer (not shown). The guard rings 1420 and 1425 are ion implanted to provide differing conductivity values. A source region 1430 can be made of an n+ GaN epitaxial material on n− GaN epitaxial channel region located between the gates formed from the gate structure 1440.

Figure 15:
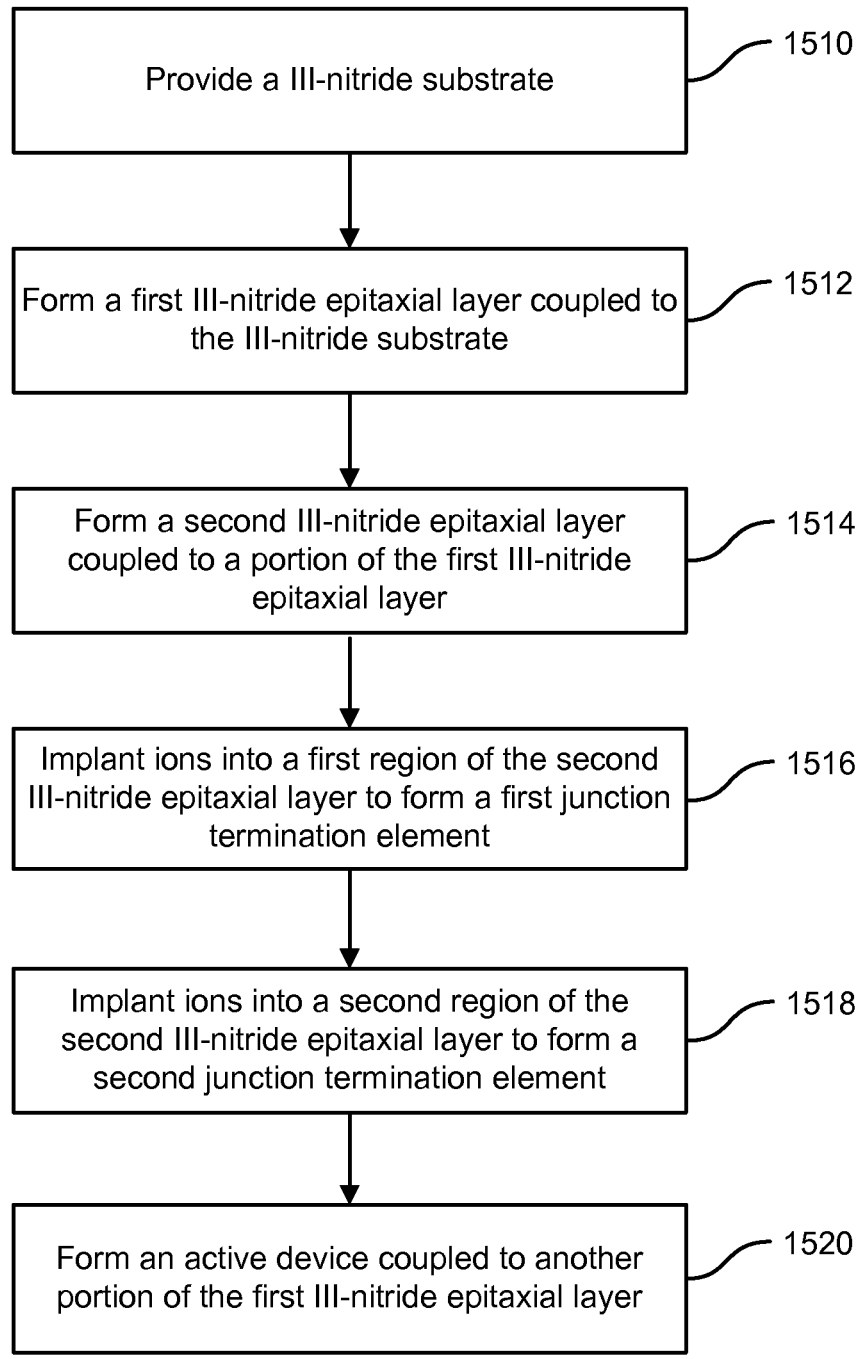
FIG. 15 is a simplified flowchart illustrating a method of fabricating a Schottky diode with junction termination structures formed through ion implantation into an epitaxial layer according to an embodiment of the present invention.

FIG. 15 is a simplified flowchart illustrating a method of fabricating a Schottky diode with junction termination structures in a III-nitride material, according to an embodiment of the present invention. Referring to FIG. 15, a III-nitride substrate is provided (1510), which can be characterized by a first conductivity type and a first dopant concentration. In an embodiment, the III-nitride is a GaN substrate with n+ conductivity type. The method also includes forming a first III-nitride epitaxial layer (e.g., an n-type GaN epitaxial layer) coupled to the III-nitride substrate (1512). The III-nitride substrate and first III-nitride epitaxial layer are characterized by a first conductivity type, for example n-type conductivity, and the first III-nitride epitaxial layer is characterized by a second dopant concentration less than the first dopant concentration. Using the homoepitaxy techniques described herein, the thickness of the first III-nitride epitaxial layer can be thicker than available using conventional techniques, for example, between about 0.5 µm and about 100 µm.

The method further includes forming (e.g., selectively forming) a second III-nitride epitaxial layer coupled to the first III-nitride epitaxial layer (1514). As described below, a portion of the first III-nitride epitaxial layer is exposed after formation of the second III-nitride epitaxial layer. The second III-nitride epitaxial layer (e.g., a GaN epitaxial layer of a p+ conductivity type) is characterized by a second conductivity type opposite to the first conductivity type. The second III-nitride epitaxial layer is not formed on the entire surface of the first III-nitride epitaxial layer, but only on a fraction less than one of the entire surface, thereby leaving an exposed portion of the first III-nitride epitaxial layer. The method additionally includes implanting ions into a first region of the second III-nitride epitaxial layer to form a first junction termination element (1516). The first junction termination element is characterized by a first electrical conductivity. The method further includes implanting ions into a second region of the second III-nitride epitaxial layer to form a second junction termination element (1518). The second junction termination element is characterized by a second electrical conductivity less than the first electrical conductivity. In some embodiments, the second region can be implanted using a multi-step ion implantation process in which both the first region and the second region are implanted at a first level of the layer and then the second region is implanted at a second level deeper or shallower than the first level.

As illustrated in FIGS. 12-14 and discussed elsewhere herein, any number between one to seven or more junction termination elements can be formed to provide junction termination for the Schottky diode or other active devices. Furthermore, the junction termination structures can be shaped any of a variety of ways, according to the physical characteristics of the Schottky diode or other active devices and other considerations.

Additionally, the method includes forming an active device coupled to the first III-nitride epitaxial layer (1520). The formation of the active device can include forming a metallic structure electrically coupled to the first III-nitride epitaxial layer to create a Schottky contact between the metallic structure and the first III-nitride epitaxial layer, which forms the drift layer. The metallic structure further can be deposited and patterned to overlap the first (i.e., closest) junction termination structures. An optional metallic field plate coupled to at least one termination element is provided to alter or enhance junction termination, depending on desired functionality. Moreover, as illustrated in FIG. 7, a backside Ohmic metal can formed on a first surface of the III-nitride substrate opposing a surface of the III-nitride substrate coupled with the first III-nitride epitaxial layer, providing a cathode for the Schottky diode. The various epitaxial layers used to form the Schottky diode and junction termination structures do not have to be uniform in dopant concentration as a function of thickness, but may utilize varying doping profiles as appropriate to the particular application.

It should be appreciated that the specific steps illustrated in FIG. 15 provide a particular method of fabricating a Schottky diode with junction termination structures according to an embodiment of the present invention. Other sequences of steps may also be performed according to alternative embodiments. For example, alternative embodiments of the present invention may perform the steps outlined above in a different order. Moreover, the individual steps illustrated in FIG. 15 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 16:
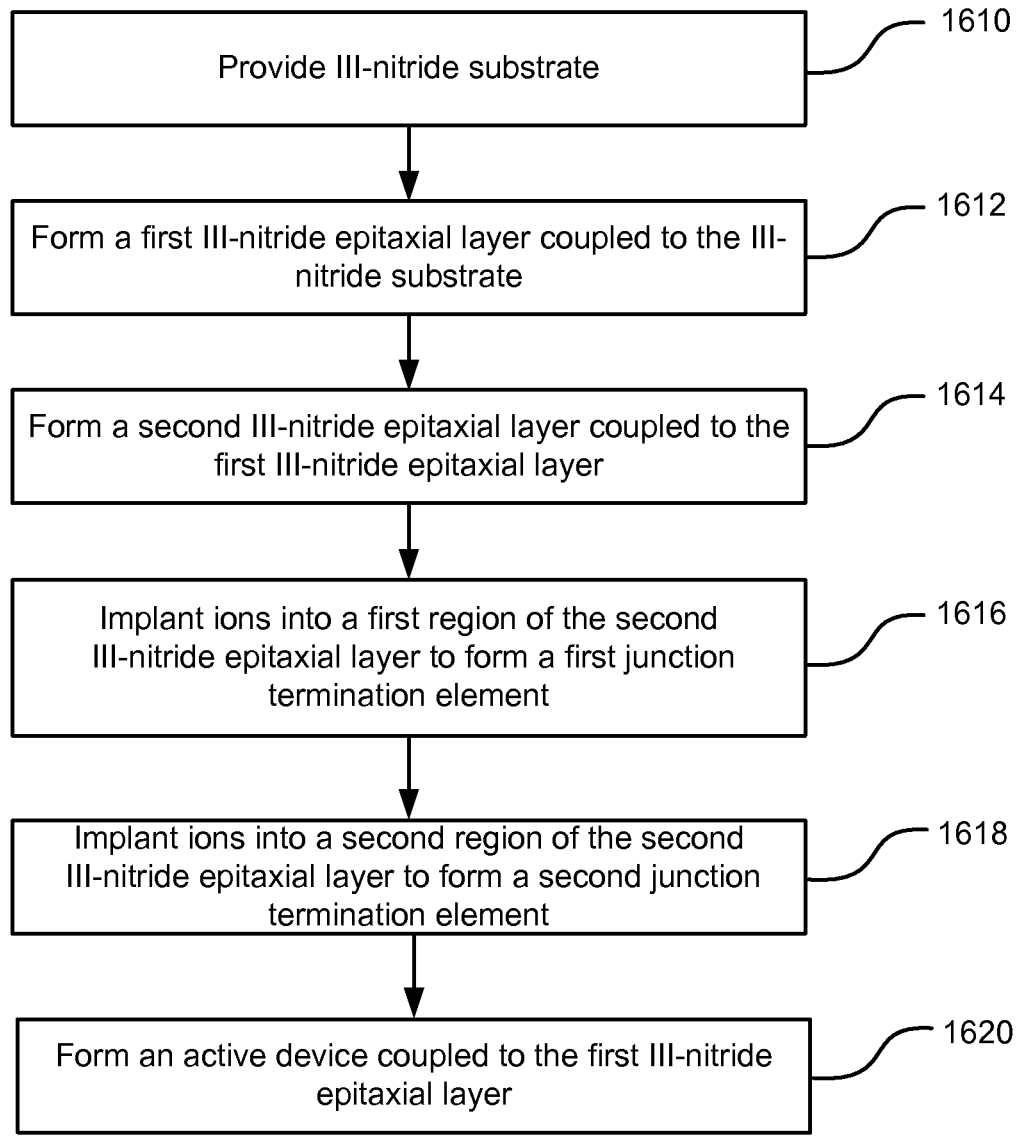
FIG. 16 is a simplified flowchart illustrating a method of fabricating a PN diode with junction termination structures formed through ion implantation into an epitaxial layer according to an embodiment of the present invention.

FIG. 16 is a simplified flowchart illustrating a method of fabricating a PIN or PN diode with junction termination structures in a III-nitride material, according to an embodiment of the present invention. Similar to the method illustrated in FIG. 15, a III-nitride substrate is provided (1610), having a first conductivity type and a first dopant concentration. The method also includes forming a first III-nitride epitaxial layer (e.g., an n-type GaN epitaxial layer) coupled to the III-nitride substrate (1612). In one embodiment, the first III-nitride epitaxial layer can be doped in a manner similar to the Schottky diode of FIG. 15, to make a PN diode. In another embodiment, the first III-nitride epitaxial layer can be an intrinsic or very lightly doped layer to function as the intrinsic region of a PIN diode.

The method further includes forming a second III-nitride epitaxial layer coupled to the first III-nitride epitaxial layer (1614). The second III-nitride epitaxial layer (e.g., a GaN epitaxial layer of a p+ conductivity type) is characterized by a second conductivity type. Depending on the conductivity type of the second III-nitride epitaxial layer, the device structure forms the P or N region of the PN diode. The substrate and epitaxial layers discussed herein can be referred to as an epitaxial structure.

The method additionally includes implanting ions into a first region of the second III-nitride epitaxial layer to form a first junction termination element (1616) and implanting ions into a second region of the second III-nitride epitaxial layer to form a second junction termination element (1618).

One or more active devices can be fabricated in the device region and one or more junction termination structures can be fabricated in a variety of geometries, including circumscribing the active devices. Thus, using embodiments of the present invention, one or more active devices can be formed in a device region of the epitaxial structure and a junction termination structure can be formed in a junction termination region of the epitaxial structure.

The method includes forming an active device coupled to the first III-nitride epitaxial layer (1620) and can include forming a metallic structure electrically coupled to the active device(s) to create an Ohmic metal contact of the PN diode. Additionally, a metallic field plate can be coupled to at least one junction termination element to alter or enhance junction termination, depending on desired functionality. Moreover, similar to the method for creating the Schottky diode, the method can include forming a backside Ohmic metal coupled to the III-nitride substrate. The various epitaxial layers used to form the PN diode and junction termination structures do not have to be uniform in dopant concentration as a function of thickness, but may utilize varying doping profiles as appropriate to the particular application.

It should be appreciated that the specific steps illustrated in FIG. 16 provide a particular method of fabricating a PN diode with junction termination structures according to an embodiment of the present invention. Other sequences of steps may also be performed according to alternative embodiments. For example, alternative embodiments of the present invention may perform the steps outlined above in a different order. Moreover, the individual steps illustrated in FIG. 16 may include multiple sub-steps that may be performed in various sequences as appropriate to the individual step. Furthermore, additional steps may be added or removed depending on the particular applications. One of ordinary skill in the art would recognize many variations, modifications, and alternatives.

As illustrated herein, junction termination structures can be provided in any of a variety of shapes and forms, depending on physical features of the semiconductor device for which the junction termination structures provide junction termination. For instance, in certain embodiments, junction termination structures may not circumscribe the semiconductor device. Additionally or alternatively, conductivity types of the examples provided herein can be reversed (e.g., replacing an n-type semiconductor material with a p-type material, and vice versa), depending on desired functionality. Moreover, embodiments provided herein using GaN can use other III-nitride materials in addition or as an alternative to GaN. Other variations, alterations, modifications, and substitutions are contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor structure comprising:
    a GaN substrate having a first surface and a second surface opposing the first surface, wherein the GaN substrate is characterized by a first conductivity type and a first dopant concentration;
    a first GaN epitaxial layer of the first conductivity type coupled to the second surface of the GaN substrate; and
    a second GaN epitaxial layer of a second conductivity type coupled to the first GaN epitaxial layer, wherein the second GaN epitaxial layer comprises:
        an active device region;
        a first junction termination region in contact with the active device region of the second GaN epitaxial layer, characterized by an implantation region having a first implantation profile; and
        a second junction termination region in contact with the first junction termination region of the second GaN epitaxial layer, characterized by an implantation region having a second implantation profile.

2. The semiconductor structure of claim 1 further comprising a metallic structure electrically coupled to the first surface of the GaN substrate.

3. The semiconductor structure of claim 1 further comprising a Schottky contact electrically coupled to the active device region.

4. The semiconductor structure of claim 3 wherein the active device region further comprises:
    an exposed portion of the first GaN epitaxial layer; and
    a Schottky contact electrically coupled to the exposed portion of the first GaN epitaxial layer.

5. The semiconductor structure of claim 3 further comprising:
- a metallic field plate coupled to the Schottky contact and extending laterally over at least a portion of the first junction termination region; and
- a dielectric layer electrically isolating the first junction termination region from the metallic field plate.

6. The semiconductor structure of claim 1 wherein the active device region includes at least a portion of a PN diode, the PN diode comprising at least a portion of the first GaN epitaxial layer and at least a portion of the second GaN epitaxial layer.

7. The semiconductor structure of claim 1 wherein the active device region includes one or more elements of a JFET.

8. The semiconductor structure of claim 1 wherein the active device region includes at least a portion of a vertical Schottky diode.

9. The semiconductor structure of claim 1 wherein the first junction termination region circumscribes the active device region.

10. The semiconductor structure of claim 9 wherein the second junction termination region circumscribes the first junction termination region.

* * * * *